(12) United States Patent
Kuisma

(10) Patent No.: US 10,782,130 B2
(45) Date of Patent: *Sep. 22, 2020

(54) CONCATENATED SUSPENSION IN A PIEZOELECTRIC GYROSCOPE

(71) Applicant: MURATA MANUFACTURING CO., LTD., Nagaokakyo-shi, Kyoto (JP)

(72) Inventor: Heikki Kuisma, Helsinki (FI)

(73) Assignee: MURATA MANUFACTURING CO., LTD., Nagaokakyo-Shi, Kyoto (JP)

( * ) Notice: Subject to any disclaimer, the term of this patent is extended or adjusted under 35 U.S.C. 154(b) by 209 days.

This patent is subject to a terminal disclaimer.

(21) Appl. No.: 15/988,696

(22) Filed: May 24, 2018

(65) Prior Publication Data

US 2018/0340776 A1    Nov. 29, 2018

(30) Foreign Application Priority Data

May 24, 2017  (FI) ..................................... 20175467
May 24, 2017  (FI) ..................................... 20175469
Sep. 25, 2017  (FI) ..................................... 20175850

(51) Int. Cl.
*G01C 19/5747* (2012.01)
*G01C 19/5642* (2012.01)
(Continued)

(52) U.S. Cl.
CPC ..... *G01C 19/5747* (2013.01); *G01C 19/5642* (2013.01); *G01C 19/5712* (2013.01); *G01C 19/5769* (2013.01); *B81B 2201/0242* (2013.01)

(58) Field of Classification Search
CPC ............ G01C 19/5719; G01C 19/5712; G01C 19/574; G01C 19/5642; G01C 19/5747; G01C 19/5769; G01C 19/5762
See application file for complete search history.

(56) References Cited

U.S. PATENT DOCUMENTS 5,166,571 A   11/1992  Konno et al.
6,561,028 B1   5/2003  Aigner et al.
(Continued)

FOREIGN PATENT DOCUMENTS

EP    1 688 705 A2   8/2006
EP    2 899 503 A1   7/2015
(Continued)

OTHER PUBLICATIONS

European Search Report application No. EP 18 17 3731 dated Sep. 19, 2018.

(Continued)

*Primary Examiner* — Helen C Kwok
(74) *Attorney, Agent, or Firm* — Squire Patton Boggs (US) LLP

(57) ABSTRACT

The disclosure describes a microelectromechanical gyroscope comprising a substrate and at least one inertial mass suspended from an anchor points by a suspension structure configured to allow the first inertial mass to oscillate rotationally both in the device plane and out of the device plane. The suspension structure comprises a set of first suspenders coated with piezoelectric transducer structures configured drive or detect the oscillating motion of the suspended inertial mass in the device plane, and a set of second suspenders coated with piezoelectric transducer structures configured to drive or detect the oscillating motion of the suspended inertial mass out of the device plane. The set of first suspenders and set of second suspenders are concatenated in the suspension structure.

12 Claims, 15 Drawing Sheets

(51) Int. Cl.
*G01C 19/5712* (2012.01)
*G01C 19/5769* (2012.01)

(56) References Cited

U.S. PATENT DOCUMENTS

| | | | |
|---|---|---|---|
| 2004/0250620 A1 | 12/2004 | Nicu et al. | |
| 2005/0066728 A1* | 3/2005 | Chojnacki | G01C 19/5719 |
| | | | 73/514.16 |
| 2006/0156813 A1* | 7/2006 | Blomqvist | G01C 19/5712 |
| | | | 73/504.12 |
| 2006/0156814 A1* | 7/2006 | Blomqvist | G01C 19/5712 |
| | | | 73/504.12 |
| 2006/0169041 A1 | 8/2006 | Madni et al. | |
| 2009/0320594 A1 | 12/2009 | Ohuchi et al. | |
| 2010/0077858 A1 | 4/2010 | Kawakubo et al. | |
| 2010/0083756 A1 | 4/2010 | Merz et al. | |
| 2010/0222998 A1* | 9/2010 | Blomqvist | G01C 19/5747 |
| | | | 701/532 |
| 2010/0242604 A1 | 9/2010 | Sammoura et al. | |
| 2010/0309536 A1 | 12/2010 | Akanuma et al. | |
| 2010/0313657 A1 | 12/2010 | Trusov et al. | |
| 2011/0132087 A1 | 6/2011 | Ohms et al. | |
| 2011/0265564 A1 | 11/2011 | Acar et al. | |
| 2011/0270569 A1* | 11/2011 | Stephanou | G01C 19/5712 |
| | | | 702/141 |
| 2013/0019682 A1 | 1/2013 | Hsu | |
| 2013/0068018 A1* | 3/2013 | Seeger | G01C 19/5712 |
| | | | 73/504.12 |
| 2013/0091948 A1 | 4/2013 | Yamamoto | |
| 2013/0283909 A1 | 10/2013 | Furuhata | |
| 2014/0266170 A1 | 9/2014 | Seeger et al. | |
| 2014/0283602 A1 | 9/2014 | Yamamoto | |
| 2015/0013455 A1* | 1/2015 | Deimerly | G01C 19/5747 |
| | | | 73/511 |
| 2015/0068308 A1* | 3/2015 | Blomqvist | B81B 7/0058 |
| | | | 73/504.12 |
| 2015/0316377 A1 | 11/2015 | Gerson et al. | |
| 2016/0146605 A1* | 5/2016 | Furuhata | G01C 19/5712 |
| | | | 73/504.12 |
| 2016/0211778 A1 | 7/2016 | Okada et al. | |
| 2018/0340775 A1* | 11/2018 | Kuisma | G01C 19/5712 |
| 2018/0340955 A1* | 11/2018 | Kuisma | H01L 41/0946 |
| 2018/0342667 A1* | 11/2018 | Kuisma | H01L 41/1136 |

FOREIGN PATENT DOCUMENTS

| | | |
|---|---|---|
| EP | 3 034 997 A1 | 6/2016 |
| JP | 2002-267451 A | 9/2002 |
| JP | 2010243479 A | 10/2010 |
| JP | 2010-256332 A | 11/2010 |
| JP | 2011158319 A | 8/2011 |
| JP | 2012-149961 A | 8/2012 |
| JP | 2013529300 A | 7/2013 |
| JP | 2016-001157 A | 1/2016 |
| JP | 2016530542 A | 9/2016 |
| WO | 2006/039560 A2 | 4/2006 |
| WO | 2011/136972 A1 | 11/2011 |
| WO | 2016/097117 A1 | 6/2016 |

OTHER PUBLICATIONS

European Search Report application No. EP 18 17 3764 dated Sep. 25, 2018.
European Search Report application No. EP 18 17 3736 dated Sep. 26, 2018.
Finnish Search Report corresponding to Appln. No. 20175467, dated Dec. 21, 2017.
Jing-Quan Liu et al., "A MEMS-based piezoelectric power generator array for vibration energy harvesting", Microelectronics Journal, Elsevier Ltd., Feb. 20, 2008, vol. 39, No. 5, pp. 802-806.
Pradeep Pai et al., "Magnetically Coupled Resonators for Rate Integrating Gyroscopes", 2014 IEEE Sensors, Nov. 2, 2014, 4 pages.
Finnish Search Report corresponding to Appln. No. 20175892, dated Apr. 18, 2018.
Finnish Search Report corresponding to Appln. No. 20175469, dated Dec. 21, 2017.
I. Roland et al., GaAs-based tuning fork microresonators: A first step towards a GaAs-based coriolis 3-axis Micro-Vibrating Rate Gyro (GaAs 3-axis µCVG), Sensors and Actuators A: Physical, Jul. 19, 2011, vol. 172, No. 1, pp. 204-211.
Finnish Search Report corresponding to Appln. No. 20175850, dated Apr. 18, 2018.
European Search Report application No. EP 18 17 3725 dated Sep. 20, 2018.

* cited by examiner

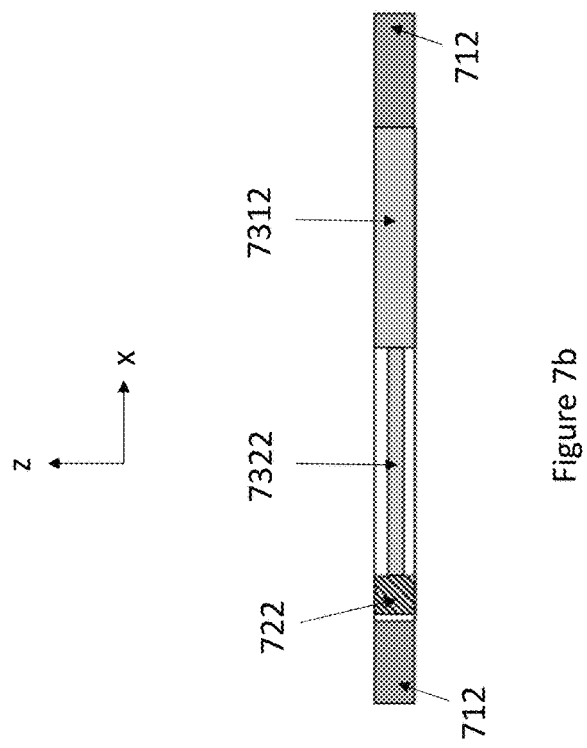
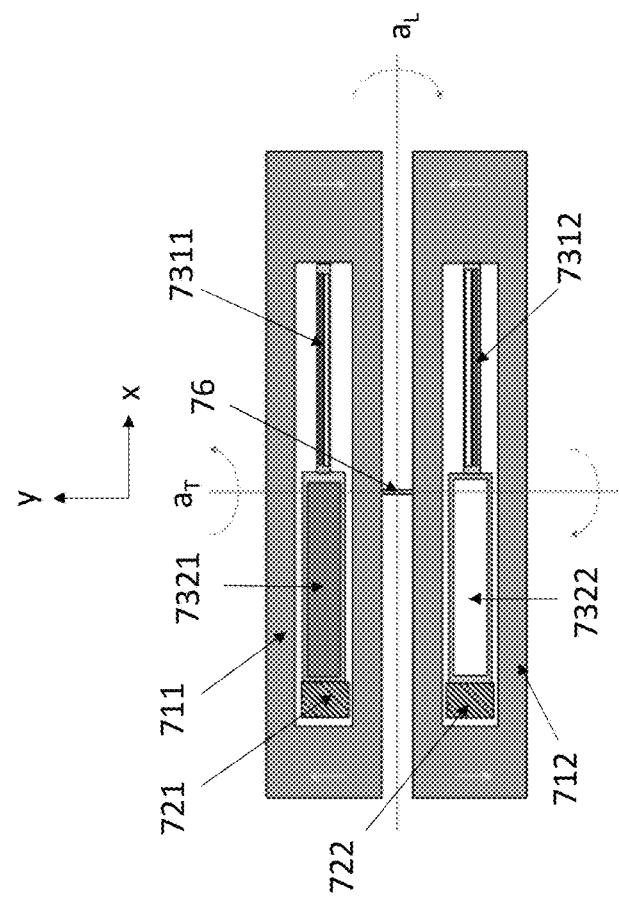
Figure 7b
Figure 7a

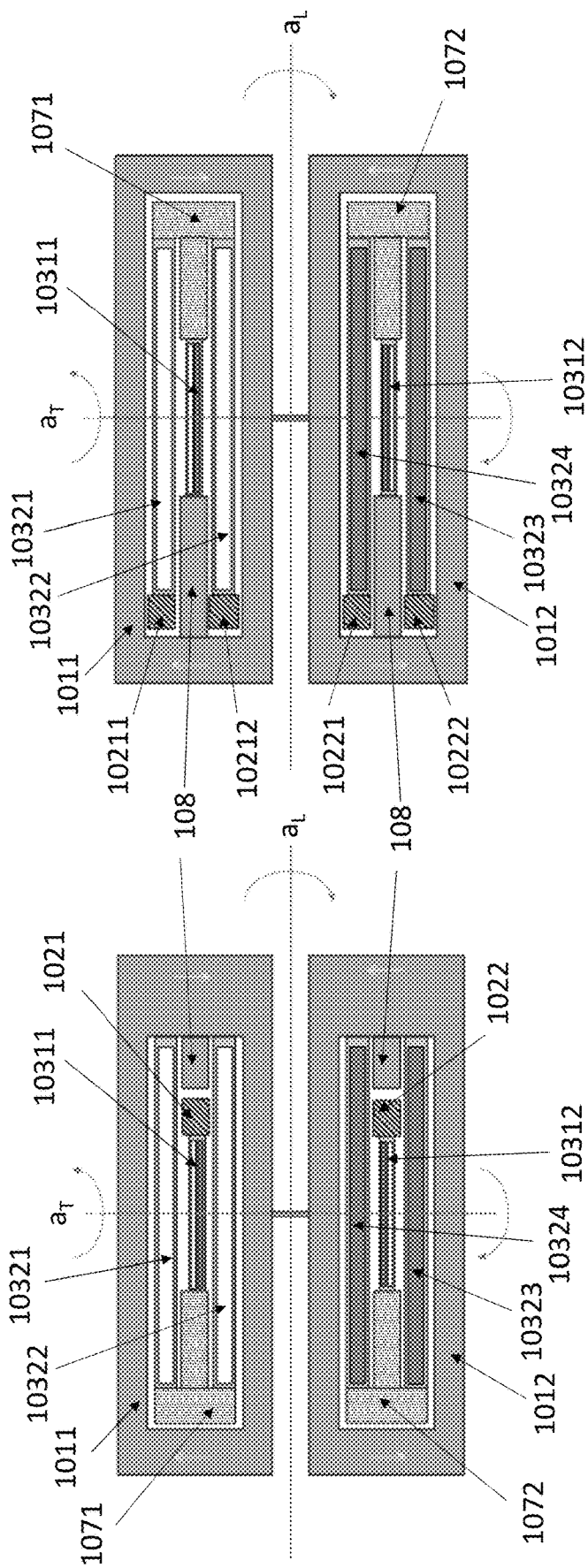

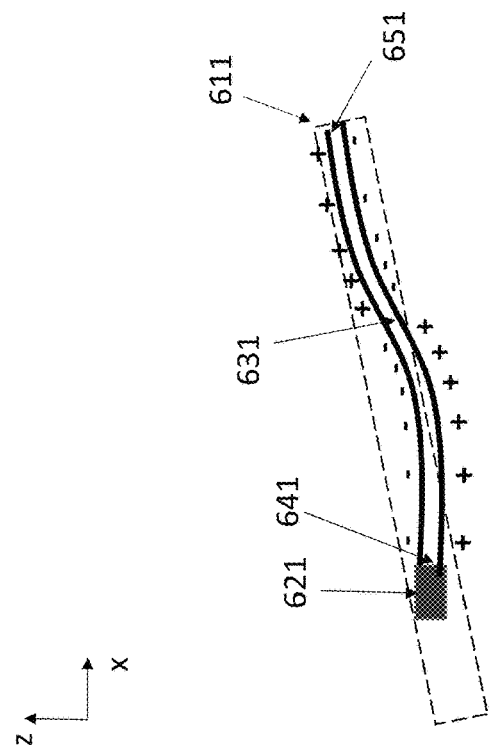
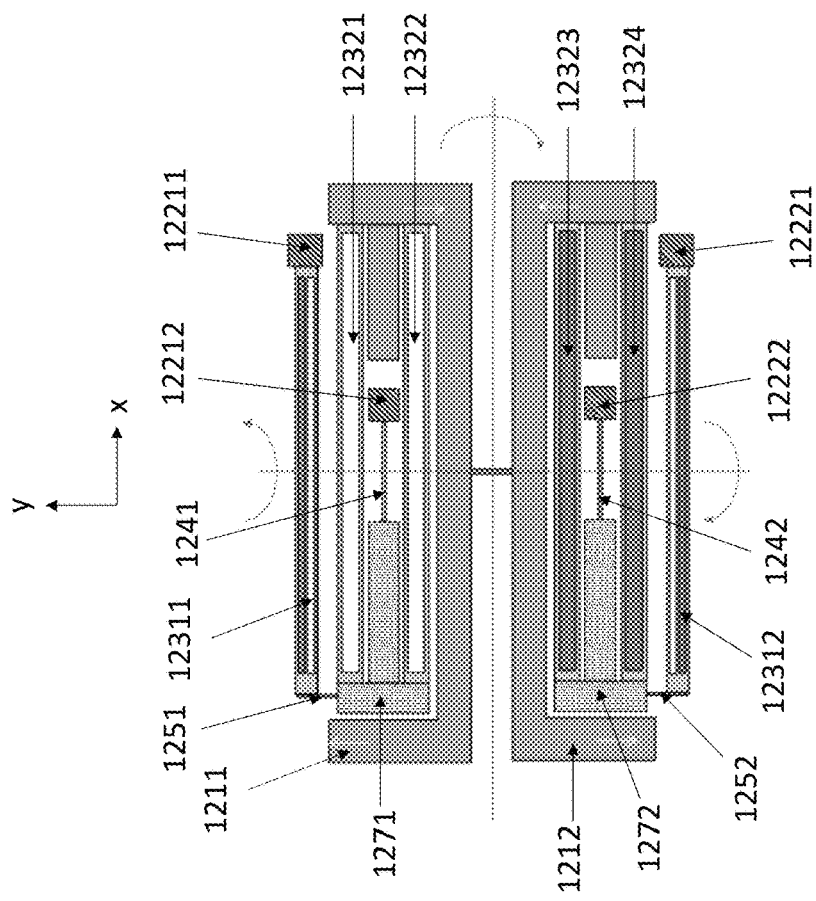
Figure 13
Figure 12

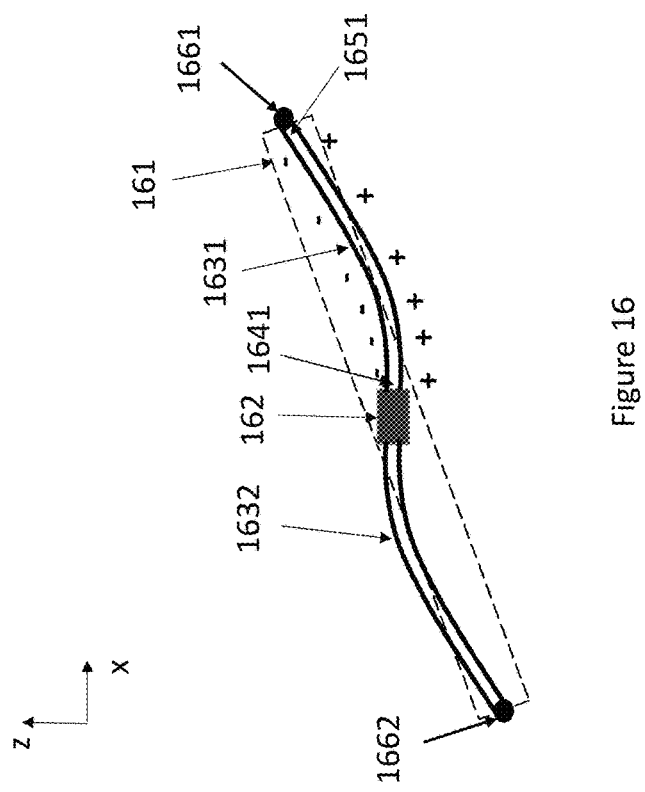
Figure 16
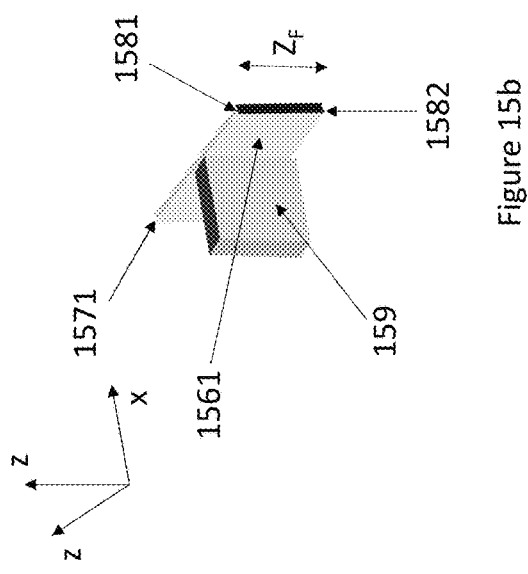
Figure 15b
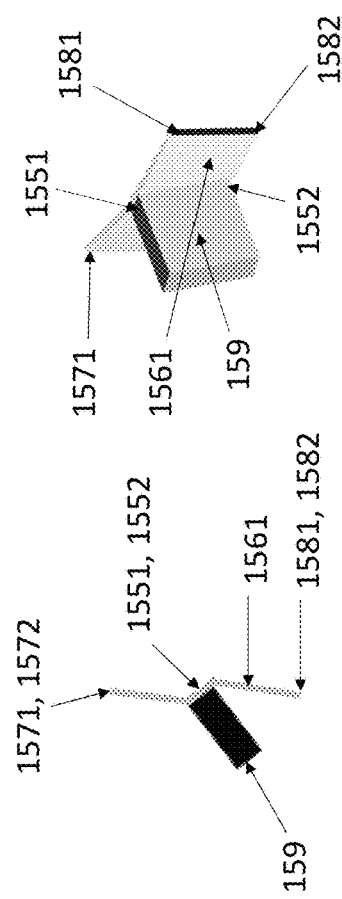
Figure 15d
Figure 15c

CONCATENATED SUSPENSION IN A PIEZOELECTRIC GYROSCOPE

FIELD OF THE DISCLOSURE

The present disclosure relates to microelectromechanical (MEMS) gyroscopes, and more particularly to MEMS gyroscopes where one or more inertial masses are driven into rotational motion by piezoelectric actuation or where the rotational motion of one or more inertial masses is detected by piezoelectric means.

BACKGROUND OF THE DISCLOSURE

MEMS gyroscopes use the Coriolis effect to measure angular velocity. In a vibrating MEMS gyroscope an inertial mass is driven into oscillating movement by an actuating drive force. This oscillation will be called "drive oscillation" or "primary oscillation" in this disclosure. The terms "drive" and "primary" may be used as synonyms in the context of vibrating gyroscopes. The drive oscillation can be either linear or rotational, but this disclosure focuses exclusively on applications where it is rotational. FIG. 1 illustrates schematically an inertial mass 111 driven in rotational oscillation about the z-axis. The drive oscillation is indicated with a solid black arrow. The actuating drive force can be generated, for example, with an electrostatic, magnetic or piezoelectric drive transducer. This disclosure focuses exclusively on applications where the actuating force is generated piezoelectrically.

When a gyroscope containing an inertial mass in drive oscillation undergoes an angular rotation rate $\Omega$ about a secondary axis (not parallel to the primary axis), the inertial mass is affected by the Coriolis force. When the drive oscillation is purely rotational, the resultant Coriolis force will be zero, but a Coriolis torque will impact the oscillation of the inertial mass. The Coriolis force and torque are determined by the magnitude and direction of the angular rotation rate vector and the inertial mass velocity vector or angular velocity vector. An inertial mass in drive oscillation will undergo an oscillating Coriolis force. This force or torque oscillates the inertial mass along or about a secondary axis perpendicular to the primary axis. This coupled oscillation along or about the secondary axis will be called "sense oscillation" or "secondary oscillation" or "coupled oscillation" in this disclosure. The terms "coupled", "sense" and "secondary" may be used as synonyms in the context of vibrating gyroscopes. In similar fashion, the drive oscillation may also be called primary oscillation.

In FIG. 1 an angular rotation rate $\Omega$ about the x-axis is indicated with a white arrow, and the resulting sense oscillation about the y-axis is indicated with a grey arrow. To measure the angular rotation rate $\Omega$, the sense oscillation may be measured through a capacitive, piezoelectric or piezoresistive transducer. The resulting electrical signal may be called a sense signal or secondary signal. This disclosure focuses exclusively on applications where the sense oscillation is measured with a piezoelectric transducer.

Gyroscopes with a single, piezoelectrically actuated inertial mass in rotational oscillation are susceptible to disturbances arising from external rotary vibrations. They may also suffer from acoustic losses due to mechanical coupling between the suspenders which attach the inertial mass to a fixed base. These problems may be circumvented with gyroscopes which include two inertial masses. The two inertial masses may be mechanically coupled to each other to oscillate synchronously.

The two inertial masses can be driven into anti-phase oscillation. In this disclosure, "synchronous anti-phase oscillation" means oscillation where, at any given time during the oscillation cycle, the first mass rotates clockwise about a first axis when the second mass rotates at equal angular velocity counter-clockwise about a second axis which is parallel with the first axis. When the first mass turns from clockwise rotation to counter-clockwise rotation about the first axis, the second turns from counter-clockwise to clockwise rotation about the second axis. In anti-phase oscillation, the torques exerted by the two inertial masses on the fixed base will be equal but opposite, and will cancel each other. The effect of external rotational vibrations on each inertial mass will also be equal, and by reading the sense transducers in a differential manner this effect can be cancelled in the sense signal.

FIG. 2a illustrates schematically a gyroscope with two inertial masses 211 and 212 oscillating in two different directions about the z-axis perpendicular to the xy-plane. The arrows are reversed in the second oscillation phase where the masses rotate in the opposite direction. The xy-plane defines the initial rest position of the inertial masses. The xy-plane will be called the device plane in this disclosure. Oscillation about the z-axis which is perpendicular to this plane will be called in-plane oscillation, or oscillation in the device plane, in this disclosure. FIG. 2b illustrates schematically a gyroscope where the same inertial masses 211 and 212 oscillate in two different directions about an axis which is parallel to the y-axis in the device plane. The degree of rotation has been greatly exaggerated. As they oscillate about the y-axis, the masses 211 and 212 rotate out of the device plane. This oscillation mode will be called out-of-plane oscillation, or oscillation out of the device plane, in this disclosure.

In both FIGS. 2a and 2b, the two inertial masses are coupled to each other by a synchronization spring 26. With a suitably constructed synchronization spring, driving only one of the inertial masses 211 and 212 into drive oscillation with a drive transducer (not illustrated) is sufficient to set the other inertial mass into anti-phase drive oscillation with the same frequency. In other words, the longitudinal bending or torsional twisting of the synchronization spring 26 can transmit drive motion from one inertial mass to the other. However, it is also possible to drive both inertial masses 211 and 212 into drive oscillation with two separate drive transducers. In this case, the bending or torsional twisting of the synchronization spring 26 synchronizes these drive oscillations to a common resonance mode. The sense oscillation, which will occur in both inertial masses, can be read through a sense transducer connected to either one of the inertial masses 211 and 212, or through two or more sense transducers, each one connected to either mass.

As illustrated in FIGS. 2a and 2b, the rotational inertial masses in piezoelectrically driven MEMS gyroscopes may advantageously have an oblong shape. They have a longitudinal length in the x-direction which exceeds their transversal width in the y-direction. The terms "longitudinal" and "transversal" will be used throughout this disclosure to refer to the illustrated x- and y-directions, respectively. The longitudinal measure of an object will primarily be referred to as a "length" and the transversal measure of an object will primarily be referred to as a "width". The term "vertical" will be used to refer to the z-direction, and the corresponding measure will be referred to as a "thickness".

One way to build a piezoelectrically driven or sensed inertial mass is to shape the inertial mass so that it at least partly surrounds the anchor point or anchor points from which it is suspended. In other words, the inertial mass may be shaped like an open or closed frame and a suspension structure may be constructed between a centrally located anchor point and fixing points on the inner edge of the inertial mass.

Document WO2011136972 discloses a piezoelectric gyroscope where piezoelectric transducers have been placed on suspenders which suspend an inertial mass from a central anchor point.

Certain technical problems are frequently encountered in piezoelectrically driven and sensed gyroscopes. One is that the transducers which drive the oscillation must be sufficiently large to generate enough actuation force, and the transducers which sense oscillation must be sufficiently large to produce a signal with a high signal-to-noise ratio. Furthermore, the drive oscillation movement may not be perfectly orthogonal to sense oscillation movement, which may introduce drive motion error components into the sense signal. This can be serious problem because the amplitude of the drive oscillation is usually much larger than the amplitude of the sense oscillation. A further problem is that the bending mode of the piezoelectric transducers may not exhibit uniform curvature along the entire length of the transducer, which can reduce both the drive force and the sense signal.

These problems have hindered the development of piezoelectric rotational gyroscopes in comparison to electrostatically driven and sensed gyroscopes, even though electrostatic gyroscopes require high bias voltages, consume more surface area and produce a capacitive output signal which is inversely proportional to the operating frequency.

BRIEF DESCRIPTION OF THE DISCLOSURE

An object of the present disclosure is to provide an apparatus for overcoming the above problems.

The objects of the disclosure are achieved by an arrangement which is characterized by what is stated in the independent claims. The preferred embodiments of the disclosure are disclosed in the dependent claims.

The disclosure is based on the idea of suspending the inertial mass from a fixed base with a suspension structure which includes parts whose flexible properties differ. These parts may in practice be formed by altering the dimensions of the suspension structure in certain designated areas. Although a suspension structure may form a unitary body which extends from an anchor point to an inertial mass, it can also be described as concatenated structure where multiple suspenders are connected in series and/or in parallel.

An advantage of the arrangements described in this disclosure is that piezoelectric transducers intended for driving or sensing oscillatory motion about a given axis can be placed on those parts of a suspension structure where the local spring constant for bending about that axis is smaller than it is in other parts of the suspension structure.

BRIEF DESCRIPTION OF THE DRAWINGS

In the following the disclosure will be described in greater detail by means of preferred embodiments with reference to the accompanying drawings, in which FIG. 1 an inertial mass driven in rotational oscillation.

FIG. 7a illustrates linear suspension structures with two concatenated suspenders.

FIG. 7b illustrates the same suspension structure from a different perspective.

FIGS. 10a-10c illustrate suspension structures with concatenated suspenders and a double U-turn intermediate body.

FIG. 12 illustrates suspension structures with concatenated suspenders and two anchor points, one of which is dedicated to structural support while the other is not.

FIG. 13 illustrates the bending mode of a suspender in a one-sided arrangement.

FIGS. 15a-15d illustrate suspension structures with flexures and the bending of a flexure.

FIG. 16 illustrates the bending mode of a suspender in a two-sided arrangement with flexures at the second attachment point.

DETAILED DESCRIPTION OF THE DISCLOSURE

Figure 2A:
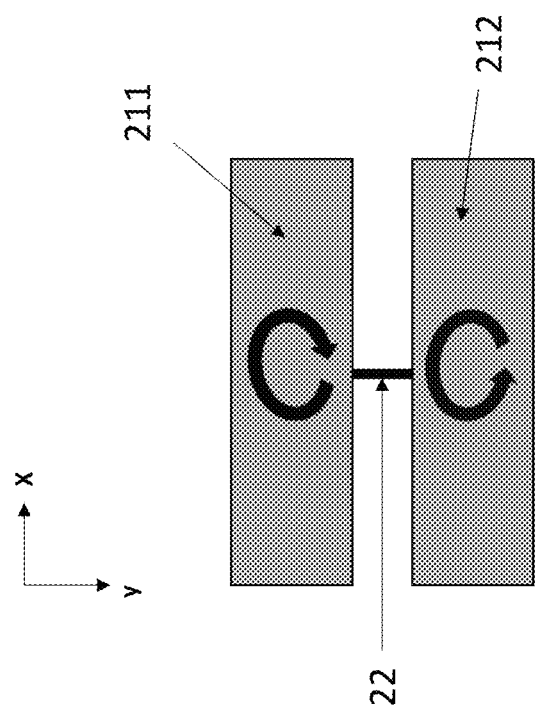
FIGS. 2a and 2b illustrate gyroscopes with inertial masses oscillating in different rotational modes.
Figure 1:
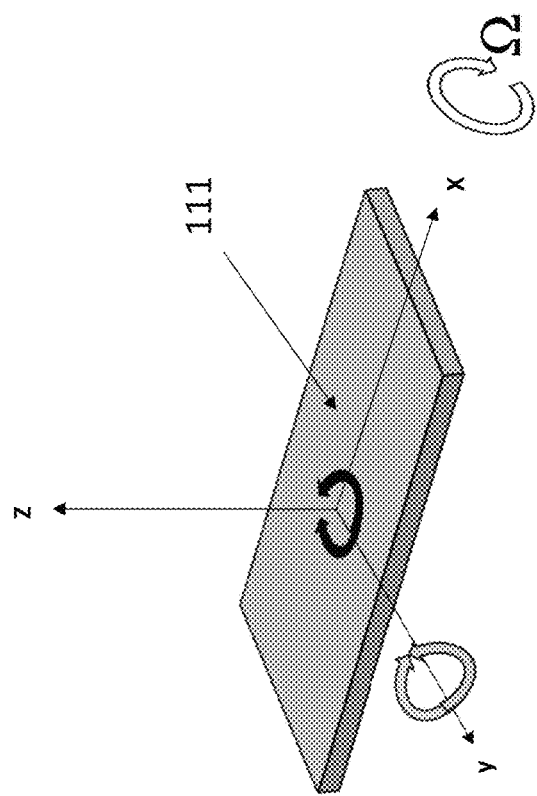
Figure 2B:
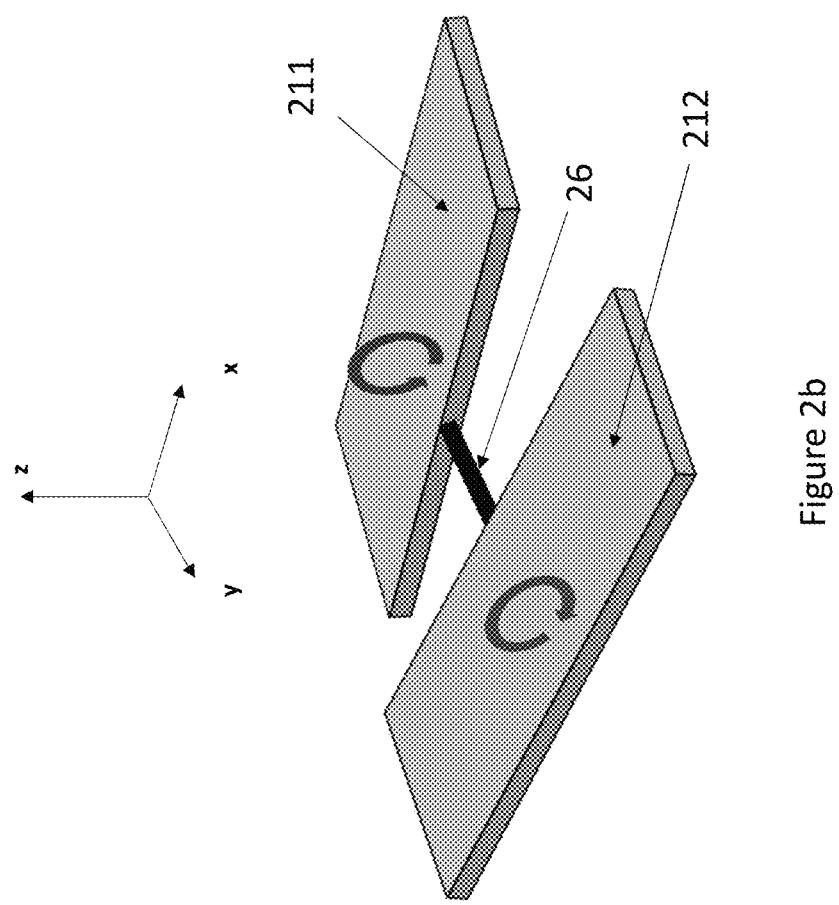

In a gyroscope undergoing angular rotation, the motion of each inertial mass will be a combination of drive oscillation and sense oscillation. If the drive oscillation is in-plane rotation, the sense oscillation will be out-of-plane rotation, and vice versa.

Any flexible structure which is mechanically connected to the mobile inertial mass, and which bends when the mass moves, can in principle be used for transmitting a driving piezoelectric force to the inertial mass, and conversely for sensing the movement of the inertial mass piezoelectrically. A piezoelectric transducer can be formed on a surface of the flexible structure by coating it with electrode layers and a piezoelectric layer, and the transducer can be put into drive operation by connecting it to a voltage or current source, or conversely into sense operation by connecting it to a voltage or current meter. The same piezoelectric transducer may sometimes be used as a drive transducer, and sometimes as a sense transducer. In this disclosure, the transducer may be said to operate in "drive mode" in the former case, and in "sense mode" in the latter case.

In practice, the area of a piezoelectric drive transducer must exceed a certain lower limit to produce a sufficiently strong driving force. But size considerations are even more important for gyroscope sense transducers because the amplitude of the sense oscillation induced by the Coriolis force is weak. A relatively large transducer area is needed to detect it. One way to increase transducer area is to suspend the inertial mass from a fixed base with large but flexible suspenders, and to prepare the piezoelectric transducers on these suspenders.

In this disclosure, a "fixed" object means an object which is much larger than the MEMS gyroscope structure, or alternatively an object which is securely attached to a larger structure, so that it cannot be moved in relation to this structure by the reaction forces generated by the oscillating inertial mass. The term "anchor point" is used to refer to a region of a fixed object where partly mobile objects such as suspenders may be attached to a fixed object. A suspender may be fixed to the anchor point at one end, and its other end may be attached to a mobile inertial mass.

In the silicon-based MEMS applications described in this disclosure, a "suspended" object means an object which is attached to a fixed base only with silicon beams. At least some of these beams are flexible, so that they allow the object to undergo rotational oscillation. Elongated silicon beams can be made flexible enough to be bent or twisted by the movement of an inertial mass if they are suitably dimensioned in relation to the size of the inertial mass. Such flexible beams may be called springs. In piezoelectric gyroscopes, springs should be sufficiently flexible to be bent by the movement of the inertial mass to which they are attached and/or by the piezoelectric transducers placed on top of them.

In this disclosure, the term "suspender" will be used as a general term for beams which attach an inertial mass to a fixed base. This term covers beams which have been dimensioned for flexibility, but also beams whose dimensions prevent them from exhibiting significant flexibility in any direction. In other words, some suspenders are flexible, others are not. Each suspender which has a piezoelectric transducer on top is flexible. Several suspenders with different elastic properties, or sets of suspenders with different elastic properties, may be attached to each other in series, so that they form a chain or a tree of concatenated suspenders. The term "suspension structure" will be used as a general term for systems which may comprise a single suspender extending from an anchor point directly to an inertial mass, or a number of suspenders and optional intermediate bodies which together form a chain or tree structure extending from an anchor point to an inertial mass.

Figure 3:
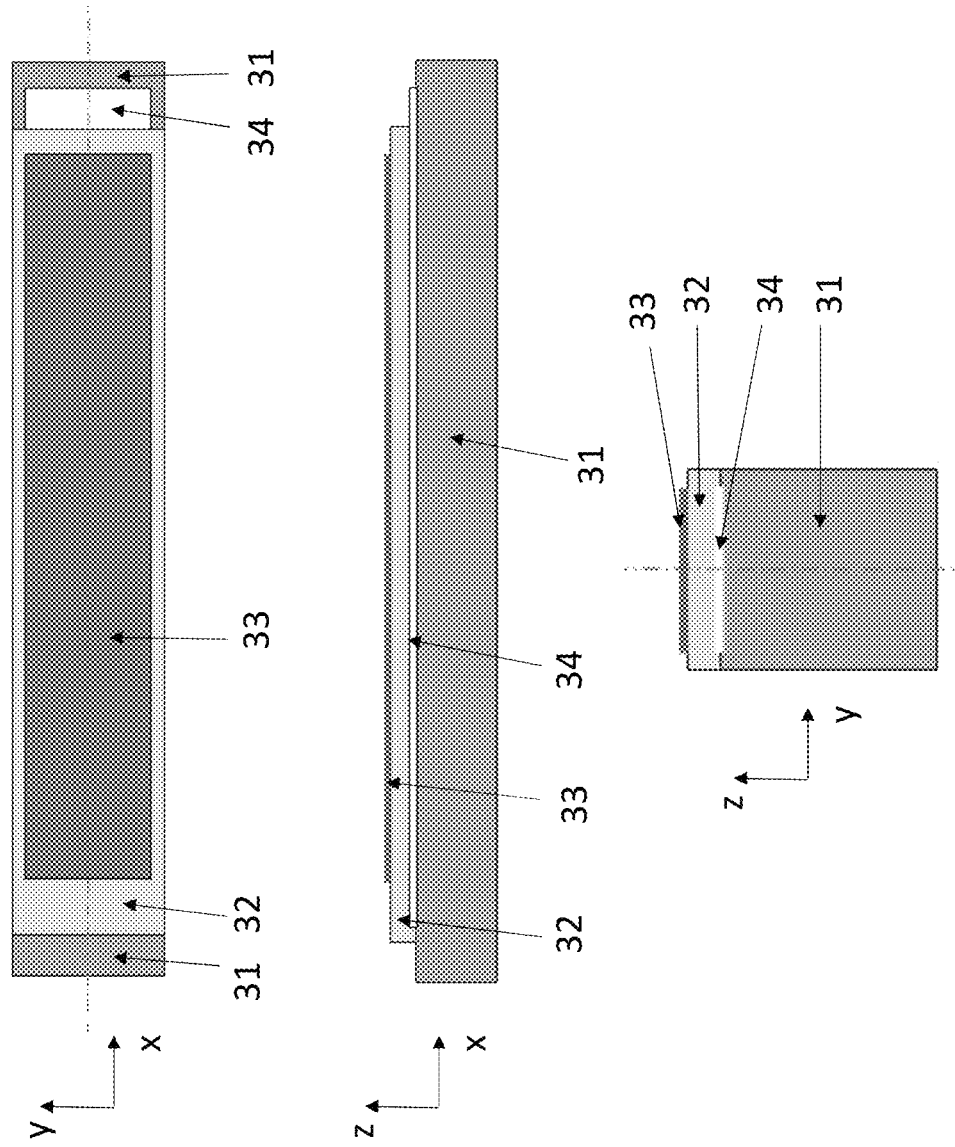
FIG. 3 illustrates an out-of-plane piezoelectric transducer on a suspender.

FIG. 3 illustrates three cross-sections of a bending piezoelectric transducer configured for out-of-plane-bending. The transducer includes a layer of piezoelectric material and two electrode layers deposited on a silicon beam 31. The transducer has an oblong shape in the x-y-plane. The transducer includes a bottom electrode layer 34, a layer of piezoelectric material 32 and a top electrode layer 33. The layers 34, 32 and 33 together form a piezoelectric transducer. The silicon beam 31 bends out of the xy-plane when a drive voltage is applied to the electrodes. Conversely, a sense voltage signal can be read from electrode layers 33 and 34 if the suspender 31 is bent out of the xy-plane by an external force.

Figure 4:
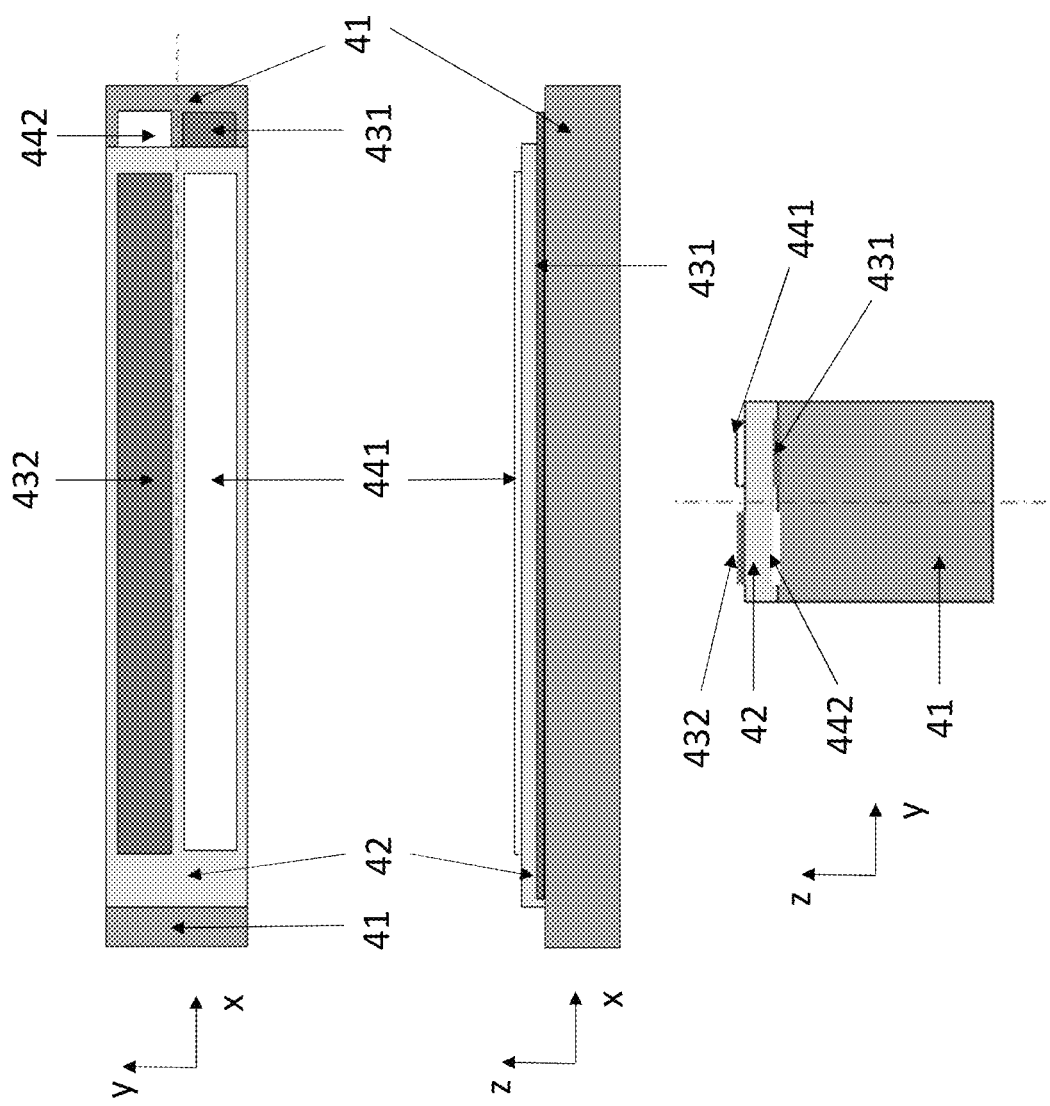
FIG. 4 illustrates an in-plane piezoelectric transducer on a suspender.

FIG. 4 illustrates three cross-sections of a bending piezoelectric transducer for in-plane-bending. This transducer includes a silicon beam 41 and a pair of first electrode layers 441 and 442, one on the upper side of the layer of piezoelectric material 42 and one on the lower side (up and down refers in this case to the direction of the z-axis). These electrodes are paired with second electrode layers 431 and 432, respectively, as illustrated in the figure. Layers 441, 42 and 431 together form a first piezoelectric transducer and layers 442, 42 and 432 together form a second piezoelectric transducer.

When drive voltages with opposite polarity are applied to the two transducers, the average y-axis strain is zero, so the transducer does not bend out of the xy-plane. However, the two transducers produce opposite strains in the xy-plane, which bends the silicon beam 41 within this plane. If the transducers are used as sense transducers, in-plane bending will generate a voltage differential between the two transducers, but out-of-plane bending will not.

The drawing conventions in FIGS. 3 and 4 will be employed throughout this disclosure to illustrate transducers for out-of-plane bending and in-plane bending, respectively. In other words, a single rectangle on a suspender will be used to indicate an out-of-plane transducer, while two parallel rectangles of opposite colour on a suspender will be used to indicate an in-plane transducer. These two parallel rectangles will primarily be referred to in the singular, as a single "in-plane transducer", even though the structure is actually a split construction comprising two transducers, as explained above.

Grey and white colours indicate polarity on out-of-plane transducers. When both a white out-of-plane transducer and a grey out-of-plane transducer are drawn in the same figure, they will actuate the inertial mass in opposite out-of-plane different directions if voltages with opposite polarity are applied between their respective top and bottom electrodes. Conversely, opposite voltages can be read from their respective top and bottom electrodes since they are bent to opposite out-of-plane directions. In the case of in-plane transducers, the ordering of the two parallel rectangles indicate polarity, so that the polarity of a transducer with a white rectangle on top (as seen in a figure) is opposite to the polarity of a transducer with a grey rectangle on top (as seen in the same figure).

The piezoelectric layer (32, 42), which may be an aluminium nitride (AlN) layer, is typically not thicker than a few microns. The thickness of the silicon beam (31, 41) may, for example, be 50 µm. In this disclosure, the total width of a set of suspenders coated with out-of-plane transducers is typically more than 100 µm, and the width of a suspender coated with an in-plane transducer is typically less than 25 µm to achieve a high flexibility ratio between these two bending directions.

When piezoelectric transducers described in this disclosure are used in the sense mode, the best signal-to-noise ratios may be achieved when the transducer capacitance equals the sum of the capacitance of the external connections and the input capacitance of the amplifier, which usually amounts to a few pF. The capacitance of the transducer is determined by its area and by the thickness of the piezoelectric layer. It can be shown that if the piezoelectric layer is a 0.8 µm thick AlN layer and the spring is 50 µm wide, then the aspect ratio of the transducer in the xy-plane (in other words, its longitudinal length in the x-direction divided by its transversal width in the y-direction) should be in the range 10-30, preferably in the range 15-25, to achieve transducer capacitances in the range 2-5 pF at typical MEMS resonator frequencies (20-50 kHz) with an inertial mass whose aspect ratio (2-20, preferably 5-10) and thickness (20-50 µm) are in practical ranges. The required transducer area in the xy-plane will be approximately 0.05 mm² to achieve a 5 pF capacitance with a 0.8 µm thick AlN layer. This area may, for example, be obtained with dimensions of 1000 µm×50 µm. The piezoelectric transducers described in this disclosure, and the suspenders on which they are coated, therefore have oblong shapes with aspect ratios in the range 10-30, preferably 15-25.

The size and dimensions of the inertial mass may be chosen more freely because multiple suspenders can be attached to the mass if it is large, as illustrated in this disclosure. The inertial masses depicted in this disclosure also have oblong shapes, but their aspect ratio may be smaller than the aspect ratios of the transducers and suspenders. An inertial mass may have two longitudinal ends on two opposing sides of an anchor point. The longitudinal ends are separated in the x-direction by a longitudinal length. An inertial mass may also have two transversal sides on two opposing sides of an anchor point, separated in the y-direction by a transversal width. However, in some embodiments the inertial mass may be asymmetric, so that it only has one transversal side on one side of the anchor point and an opening on the other side.

Figure 6:
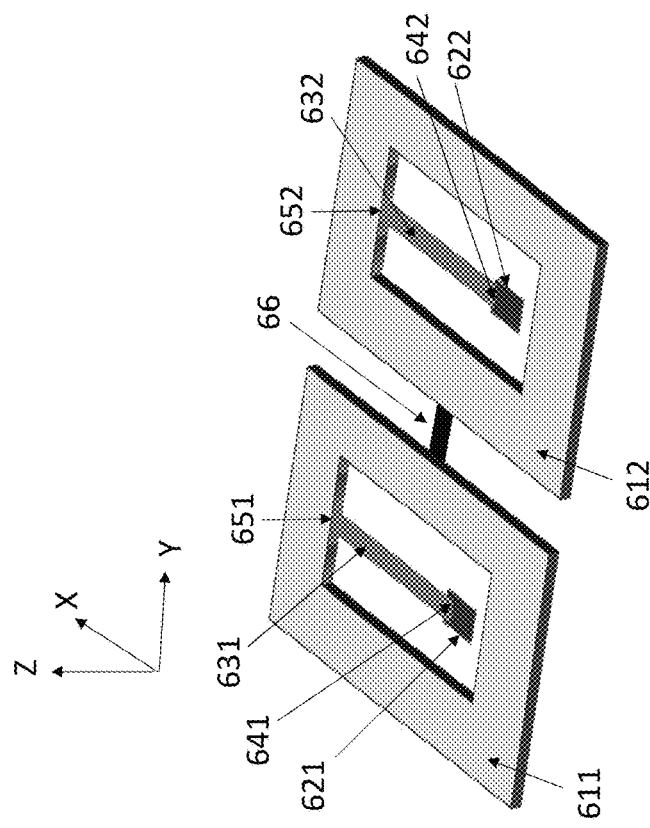
FIG. 6 illustrates a gyroscope with centrally suspended inertial masses.
Figure 5:
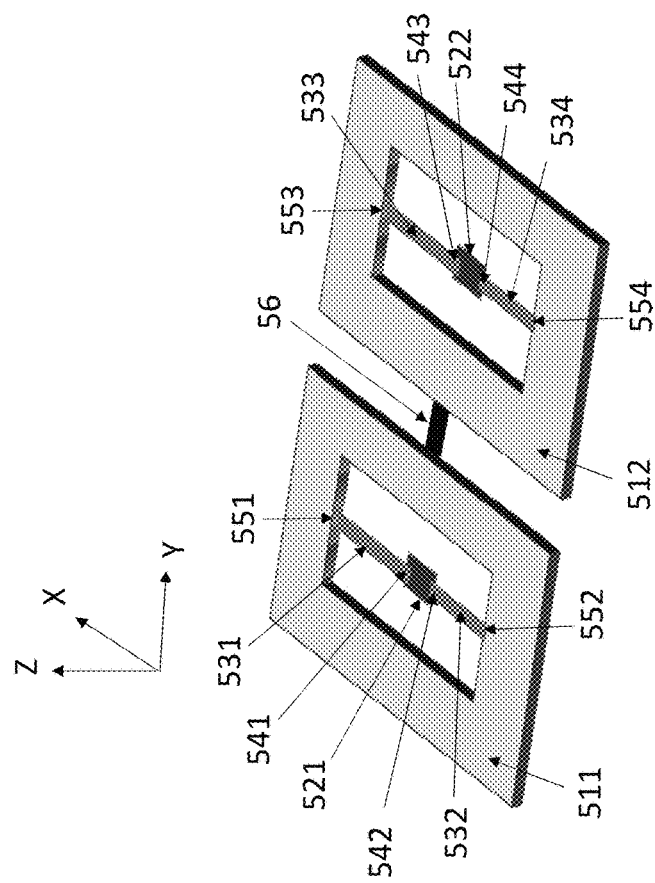
FIG. 5 illustrates a gyroscope with centrally suspended inertial masses.

FIG. 5 illustrates a gyroscope with two frame-shaped, centrally suspended inertial masses 511 and 512. Each inertial mass 511, 512 has a central opening where a fixed anchor point 521, 522 is located. Each inertial mass 511, 512 is in this case suspended from the anchor point 521, 522 by a pair of suspenders 531+532, 533+534. One end of each suspender 531-534 is attached to the anchor point 521, 522 at its first attachment point 541-544 and the other end is attached to the inertial mass 511, 512 at its second attachment point 551-554. The suspenders 531-534 may be at least partially coated with piezoelectric transducers which can generate in-plane and/or out-of-plane oscillation. Electrical contacts may be drawn to these transducers for example through the anchor points 521 and 522, or through separate loose springs dedicated for this purpose. The width and length of suspenders 531-534 allows relatively large transducers to be manufactured on their surfaces. A synchronization spring 56 couples the two inertial masses 511 and 512 to each other. FIG. 6 also illustrates a gyroscope with two frame-shaped, centrally suspended inertial masses 611 and 612. In this gyroscope, each inertial mass 611 and 612 is suspended from only one longer suspender 631 and 632.

In the gyroscopes illustrated in FIGS. 5 and 6, any suspender (531-534 and 631-632) can be dedicated either for driving the inertial masses into their primary motion (which may be either in-plane rotation or out-of-plane rotation) or for sensing the secondary motion (which will be out-of-plane rotation if the primary motion is in-plane rotation, and vice versa) which arises if the gyroscope experiences angular rotation. Each suspender can de dedicated for its intended function by preparing on it a piezoelectric transducer suitable for driving or detecting the intended motion.

However, regardless of their intended function as drivers or detectors, all suspenders will undergo the same drive oscillation when drive transducers are actuated. All suspenders will also undergo the same sense oscillation if the gyroscope experiences angular rotation. In other words, a suspender which is coated with an out-of-plane drive transducer, for example, will experience the same in-plane oscillation as another suspender in the same system which is coated with an in-plane sense transducer. It is therefore possible to combine the drive and sense functions on the same suspender by preparing a drive transducer on one part of the suspender and a sense transducer on another part of the suspender.

The deformation which occurs in a suspender due to drive oscillation is perfectly orthogonal to the deformation which occurs in the same suspender due to sense oscillation only if the suspender has a cross section with symmetry in both vertical and horizontal directions. Typically, a suspender has the shape of a square prism, where the thickness and width of the suspender remain constant and equal along the entire length of the suspender and the side walls are perfectly orthogonal to the xy-plane. But a perfect square prism with orthogonal side walls is difficult to achieve due to finite manufacturing tolerances. Suspenders often obtain slightly tilted vertical profiles where the side walls are not perfectly orthogonal to the xy-plane. The drive and sense oscillation modes of such suspenders will not be perfectly orthogonal in this case. Another potential source of error is that the sense transducer may not be perfectly aligned with the central axis of its suspender, which makes slightly responsive also to the drive oscillation.

If a suspender coated with an in-plane drive transducer, for example, does not have the shape of a perfect square prism with orthogonal side walls, it may, in addition to driving the inertial mass into the intended in-plane oscillation, simultaneously drive the inertial mass into out-of-plane oscillation. The amplitude of this out-of-plane oscillation may be small in comparison to the in-plane oscillation, but even small out-of-plane components can cause serious measurement problems because the drive oscillation amplitude is typically several orders of magnitude larger than the coupled sense oscillation amplitude at practical angular rotation rates, which may, for example, range from 0.1 degrees/second to 300 degrees/second in automobile applications. The amplitude ratio of a gyroscope is $2*\Omega/\omega$, where $\Omega$ is the rotation rate and $\omega$ is the angular frequency of the resonance. The sense oscillation amplitude range is thus from $2*10^{-8}$ to $6*10^{-5}$ times the drive oscillation amplitude. In practice, it is desirable to bring the deviation to $10^{-4}$ or less, since the remaining deviation can be compensated by electrical means. The ratio $10^{-4}$ is very difficult, if not impossible, to achieve by manufacturing control due to vertical angle tilt in etched suspenders and misalignment of the transducers on the suspenders.

In other words, deviations from perfect orthogonality will produce a direct coupling from the drive oscillation to the detected sense signal, which may completely mask the much smaller coupled signal due to sense oscillation. The sense signal component arising from directly coupled drive oscillation will have the same phase as the drive oscillation, whereas the sense signal arising from angular rotation will exhibit a 90-degree phase shift in relation to the drive oscillation. The sense signal component arising from directly coupled drive oscillation is called a quadrature component. By phase sensitive detection, the true sense signal caused by angular rotation can be filtered from the signal measured from the sense transducer(s). But if the sense signal component due to directly coupled drive oscillation is very large, it will cause overloading of the amplifier, and the separation of the in-phase signal from the total signal may not be perfect due to phase errors in phase sensitive detection. It is therefore desirable to render the directly coupled signal amplitude as small as possible, and at least below $10^{-4}$ times the drive amplitude.

Furthermore, the suspender where the drive transducer is located will also experience the deformation due to the coupled oscillation in the orthogonal direction. This will not cause any interfering signals, but it will cause some signal loss. The coupled energy on this suspender, or this part of a suspender, cannot be converted to a sense signal. If 50% of the coupled energy is lost to the drive suspender, or the drive part of a suspender, then the sense signal amplitude will be only 70% of its maximum possible value.

This disclosure presents a microelectromechanical gyroscope comprising a substrate with one or more first anchor points and one or more second anchor points. The gyroscope also comprises a first inertial mass and a second inertial mass in a device plane, wherein the first inertial mass is suspended from the one or more first anchor points by a suspension structure configured to allow the first inertial mass to oscillate rotationally both in the device plane and out of the device plane, and the second inertial mass is suspended from the one or more second anchor points by a suspension structure configured to allow the second inertial mass to oscillate rotationally both in the device plane and out of the device plane. The gyroscope further comprises a synchronization structure which attaches the first and second inertial masses to each other. The synchronization structure is configured to transmit movement between the first and second inertial masses so that they move in synchronous anti-phase drive oscillation.

At least one of the suspension structures comprises a set of first suspenders comprising one or more first suspenders coated with piezoelectric transducer structures which are configured either to drive the suspended inertial mass into oscillating motion in the device plane, or to detect the oscillating motion of the suspended inertial mass in the device plane, and a set of second suspenders comprising one or more second suspenders coated with piezoelectric transducer structures which are configured either to detect the oscillating motion of the suspended inertial mass out of the device plane, or to drive the suspended inertial mass into oscillating motion out of the device plane. The set of first suspenders and set of second suspenders are concatenated in the at least one suspension structure.

If the set of first suspenders is used for driving, the set of second suspenders is used for detection, and vice versa.

A suspension structure, as defined in this disclosure, is a body of silicon positioned between an anchor point and an inertial mass. Although the suspension structure is preferably a unitary body of silicon, different regions of the suspension structure can be formed so that they differ from each other in terms of their length, width, and/or thickness. For example, a first part of a suspension structure may be etched so that its dimension is very thin in a first direction and thick in a second direction, making it inherently flexible for bending in the first direction, but not the second. A second part of the same suspension structure may be etched so that its dimension is very thick in the first direction but thin in the second direction, making it inherently flexible for bending in the second direction, but not the first. A third part of the same suspension structure may be etched so that is dimension is thick both in the first and in the second direction, making it inherently stiff for bending in both directions.

In all embodiments presented in this disclosure, each suspension structure is, as a whole, sufficiently flexible to allow its inertial mass to oscillate rotationally both in the device plane and out of the device plane. The suspension structure is configured to allow rotational oscillation in both directions by ensuring that it is sufficiently flexible. However, flexibility in a given direction (in-plane or out-of-plane) may be located in just one part of a suspension structure. For example, a first part of a suspension structure may be flexible for out-of-plane bending, while a second part of the same suspension structure may not be flexible for out-of-plane bending. The out-of-plane deformation which occurs in the suspension structure will in this case take place only in the first part. The second part will move along in out-of-plane motion as a rigid extension of the first part, but it may not undergo any out-of-plane bending. The same situation can obtain in in-plane bending. The roles of the first and second parts of the suspension structure may then be reversed, so that the first remains rigid but the second bends.

In other words, suspension structures can be configured to allow the inertial masses to oscillate rotationally, both in the device plane and out of the device plane, without necessarily having uniform in-plane and out-of-plane flexibility in all parts of the suspension structure. In-plane flexibility can be prepared in some parts of the suspension structure, out-of-plane flexibility in other parts. However, practical design considerations may sometimes prevent flexibility optimization for all coated suspenders. In such situations, it may be a good option to optimize only the dimensions and flexibility of the suspenders which are coated with sense transducers, while the dimensions of suspenders coated with drive transducers may be optimized to meet other design considerations.

In this disclosure, regions of a suspension structure whose dimensions and flexible properties differ from each other in this manner are understood to constitute separate suspenders. In other words, a suspension structure may comprise multiple suspenders connected in series or parallel, optionally with an intermediate body in between. The suspension structure may comprise just one chain of suspenders between one anchor point and the inertial mass, several chains which branch outward from one anchor point to the inertial mass, or several chains which branch outward from several anchor points to the inertial mass.

A suspension structure may comprise a set of first suspenders with suspenders which are significantly less flexible in a first direction orthogonal to the longitudinal symmetry axis than they are in a second direction which is orthogonal to both the longitudinal symmetry axis and the first direction. The suspenders in this first set may be concatenated with suspenders from a set of second suspenders, where the second suspenders are significantly less flexible in the second direction than in the first. In other words, the sets of first and second suspenders may exhibit flexibility in directions which are orthogonal to each other and orthogonal to the longitudinal symmetry axis of the gyroscope.

In this disclosure, the term "concatenated" has the following meaning. A set of one or more first suspenders is concatenated with a set of one or more second suspenders if it is possible to traverse the suspension structure from at least one anchor point to the inertial mass by first traversing any of the first suspenders, and then traversing any of the second suspenders (without having to return back across the first suspender which has already been traversed). The order may be reversed, so that the second suspender lies closer to the anchor point and is traversed first, followed by a traversal of any of the first suspenders. An intermediate body may be located and traversed in between the first and second suspenders.

In other words, the first set of suspenders is concatenated with the second set of suspenders if, for each suspender in each set, there exists a route (with no back and forth movement across one suspender) from at least one anchor point to the inertial mass which comprises that suspender and any suspender from the other set. Intermediate bodies which belong to neither the first set nor the second set may be connected between the first suspenders and the second suspenders. Intermediate bodies may, in particular, facilitate branching of the suspension structure into multiple parallel structures, as will be described in more detail below.

In other words, in the case where first suspenders are closer to an anchor point, a suspension structure may comprise one or more first suspenders whose first end is connected to the anchor point. The second ends of these first suspenders may be connected to the first ends of one or more second suspenders. The second ends of these second suspenders may be connected to the inertial mass. Alternatively, the concatenated structure may be as described above, except that the second ends of the first suspenders may be connected to an intermediate body, and the first ends of the second suspenders may be connected to the same intermediate body. The intermediate body may be a branching structure which allows the number of second suspenders to be greater than the number of first suspenders.

In order to quantify the differences in flexible properties which should obtain between suspenders in the first and the second sets of suspenders, it may be noted that each set may comprise suspenders connected both in series and in parallel. In this disclosure, each set of suspenders is treated as a whole, so that each set of suspenders is characterized by one in-plane spring constant and one out-of-plane spring constant. The combined spring constants of any given set of suspenders can be calculated when the spring constants of each suspender in the set and the geometry of the suspension structure is known.

In this disclosure, the term "in-plane spring constant" refers to the proportionality coefficient between (1) the angle of rotation of an inertial mass about a vertical axis, and (2) the restoring torque by which a given set of suspenders in its suspension structure acts on the inertial mass. In other words. Conversely, the term "out-of-plane spring constant" refers to the proportionality coefficient between (1) the angle of rotation of an inertial mass about a transversal axis, and (2) the restoring torque by which a given set of suspenders in its suspension structure acts on the inertial mass.

The resonance frequency f of an inertial mass in rotational oscillation about a rotation axis is:

$$f = \frac{1}{2\pi}\sqrt{\frac{k}{I}}$$

where k is the spring constant for that rotational motion and I is the moment of inertia of the inertial mass in relation to that rotation axis. The moment of inertia of an inertial of an inertial mass in relation to its transversal symmetry axis (out-of-plane rotation axis) is equal to its moment of inertia in relation to its vertical symmetry axis (in-plane rotation axis). Since the in-plane and out-of-plane resonance frequencies should preferably be equal or nearly equal, the spring constant of the suspension structure for in-plane oscillation should preferably be equal or nearly equal to the spring constant of the suspension structure for out-of-plane oscillation.

When a suspension structure comprises a first set of suspenders concatenated (optionally through an intermediate body) with a second set of suspenders a described above, the in-plane spring constant of the entire suspension structure should preferably be determined by the first set of suspenders, which is configured to be significantly more flexible in in-plane bending. Conversely, the out-of-plane spring constant of the entire suspension structure should preferably be determined by the second set of suspenders, which is configured to be significantly more flexible in out-of-plane bending. This situation may be obtained by making the out-of-plane spring constant of the first set of suspenders ($k_{OP1}$) significantly larger than both the out-of-plane spring constant of the second set of suspenders ($k_{OP2}$) and the in-plane spring constant of the first set of suspenders ($k_{IP1}$). Conversely, the in-plane spring constant of the second set of suspenders ($k_{IP2}$) may be significantly larger than both the in-plane spring constant of the first set of suspenders ($k_{IP1}$) and the out-of-plane spring constant of the second set of suspenders ($k_{OP2}$).

Assuming, by way of example, that drive oscillation is implemented as in-plane oscillation driven from the first set of suspenders, and sense oscillation is implemented as out-of-plane oscillation sensed from the second set of suspenders, an appreciable reduction in the quadrature component in the sense signal may be achieved already with a spring constant ratio which falls in the range $k_{IP2}/k_{OP2}=3 \ldots 10$. However, it may be preferable to make the spring constant ratio $k_{IP2}/k_{OP2}$ in the second set of suspenders much larger, even as large as possible, which may put it in the range $10 \ldots 100$, to really minimize the quadrature component.

Continuing the above example, a considerable increase in the sense signal may be achieved when $k_{OP1}/k_{IP1}=2 \ldots 10$, because this prevents coupled energy from being lost in the first set of suspenders which contain the drive transducers, as explained above. Increasing the spring constant ratio $k_{OP1}/k_{IP1}$ further will not improve the sense signal much, because the ratio $k_{OP1}/k_{IP1}=10$ is already sufficient to bring the signal amplitude to within 95% of its maximum value. It may in some applications be feasible to accept the ratio $k_{OP1}/k_{IP1}=1$ in the first set of suspenders, and only take the benefit of reducing the quadrature signal by a large $k_{IP2}/k_{OP2}$-ratio in the second set of suspenders. This simpler option may sometimes be preferable due to the design constraints which must be met for both ratios to be maximized.

In other words, the transducer structures on the set of first suspenders may drive the suspended inertial mass into oscillating motion in the device plane, the transducer structures on the set of second suspenders may detect the oscillating motion of the suspended inertial mass out of the device plane, and the in-plane spring constant of the set of second suspenders divided by the out-of-plane spring constant of the set of second suspenders may be a ratio in the range $3 \ldots 100$.

If the drive oscillation is implemented as out-of-plane oscillation and the sense oscillation as in-plane oscillation, the corresponding ratios may be $k_{OP1}/k_{IP1}=3 \ldots 100$ and $k_{IP2}/k_{OP2}=1 \ldots 10$. In other words, the transducer structures on the set of second suspenders may drive the suspended inertial mass into oscillating motion out of the device plane, the transducer structures on the set of first suspenders may detect the oscillating motion of the suspended inertial mass in the device plane, and the out-of-plane spring constant of the set of first suspenders divided by the in-plane spring constant of the set of first suspenders may be a ratio in the range $3 \ldots 100$.

It should be remembered that the magnitude of the quadrature component in the sense signal depends on how accurately the suspenders and transducers were manufactured. Consequently, the spring constant ratios needed for reducing the quadrature component below a certain level, e.g. the $10^{-4}$ level mentioned above, will be less demanding if the suspenders and transducers were manufactured with high accuracy, and more demanding if they could not be manufactured with high accuracy.

First Embodiment

In a first embodiment, the suspension structure comprises only one first suspender and one second suspender, with no intermediate body. FIG. 7 illustrates a microelectromechanical gyroscope with a first anchor point 721 and a second anchor point 722. The gyroscope also comprises a first inertial mass 711 and a second inertial mass 712 which together define the device plane (the xy-plane in FIG. 7). The synchronization structure is a spring 76 with suitable torsional and bending stiffness to facilitate anti-phase rotational drive oscillation, either in the device plane (in-plane) or out of the device plane (out-of-plane) when the inertial masses 711 and 712 oscillate at the desired resonance frequency. In this gyroscope both inertial masses are suspended from a suspension structure which comprises one first suspender (7311, 7312) and one second suspender (7321, 7322). First suspender 7311 and second suspender 7321 are concatenated without any intermediate body in between. First suspender 7312 and second suspender 7322 are also concatenated without any intermediate body in between.

Throughout this disclosure, symmetrical gyroscopes, where the first and second inertial masses are suspended from identical suspension structures, will be illustrated. However, it is possible to implement gyroscopes where the first inertial mass is suspended from a suspension structure of one kind, and the second inertial mass is suspended from a suspension structure of another kind. If these suspension structures differ markedly from another, they (and the inertial masses) will have to be carefully dimensioned to ensure that both in-plane and out-of-plane resonance oscillation can be obtained at the desired frequency. In other words, it is typically more difficult, but not impossible, to achieve resonance oscillation with asymmetrical inertial masses and suspensions structures on the two sides of the gyroscope than with symmetric ones.

Furthermore, throughout this disclosure the illustrated gyroscopes have two symmetry axes in the device plane: a longitudinal symmetry axis $a_L$ and a transversal symmetry axis $a_T$, as illustrated in FIG. 7a. The same axes have been drawn in the other Figures.

In this first embodiment, the set of first suspenders comprises one first suspender and the set of second suspenders comprises one second suspender, and that the set of first suspenders and set of second suspenders are concatenated linearly, so that the first and the second suspender extend along one longitudinal axis which is parallel to the longitudinal symmetry axis of the gyroscope. In other words, in this case the set of first suspenders comprises only one first suspender, and the set of second suspenders comprises only one second suspender.

In most, but not all, of the illustrated gyroscopes, every transducer on a suspension structure which lies on one side of at least one symmetry axis has been placed mirror-symmetrically in relation to a transducer of opposite polarity on the suspension structure on the other side of that symmetry axis. In other words, if a transducer on a certain suspender in a symmetrical gyroscope has one type of polarity, the transducer on the corresponding suspender on the opposite side of one of its symmetry axes typically has the opposite polarity. This is a beneficial arrangement because it enables perfectly symmetrical differential detection of the sense signal, which is known to cancel many errors. It also enables perfectly symmetrical differential drive, which may reduce the amount of unwanted capacitive coupling of the drive voltage. However, it is not strictly necessary to always arrange transducers in this manner because differential detection and drive without strict geometrical symmetry can be achieved also by reversing the connections to the top and bottom electrodes of the transducer (e.g. using 34 as the detection or drive electrode instead of 33 in FIG. 3, and connecting 33 to ground instead of 34).

FIGS. 7a and 7b illustrates how concatenated suspenders with different flexible properties can be obtained. These figures illustrate the suspension structure of inertial mass 712 in the device plane. The suspension structure of inertial mass 711 has the same geometry, but is not visible in FIG. 7b. As seen in FIGS. 7a and 7b, the suspender 7322 on which the out-of-plane transducer has been placed has a significantly larger transversal width in the y-direction, and a significantly smaller thickness in the z-direction than the suspender 7312 on which the in-plane transducer has been placed. This means that suspender 7322 bends much more flexibly out of the device plane than within the device plane, and suspender 7321 correspondingly bends much more flexibly in the device plane than out of the device plane.

The suspension structure where suspenders 7312 and 7322 are concatenated significantly reduces the risk of drive oscillation coupling into sense oscillation, and thereby relaxes manufacturing requirements relating to both suspender profiling and transducer alignment. If, for example, the drive oscillation in the gyroscope illustrated in FIGS. 7a and 7b is in-plane oscillation driven by the transducers on suspenders 7311 and 7312, then the bending which occurs in the suspension structure due to drive oscillation will to a great extent be restricted only to suspenders 7311 and 7312. The comparatively larger transversal width of suspenders 7321 and 7322 ensures that the in-plane oscillation which takes place in these suspenders has a very small amplitude. This in-plane oscillation in suspenders 7321 and 7322 will therefore not easily couple into the sense signal measured from the out-of-plane transducers placed on these suspenders. The situations is analogous if the drive oscillation is out-of-plane oscillation driven by the transducers on suspenders 7321 and 7322, and the sense oscillation is in-plane oscillation sensed by the transducers on suspenders 7311 and 7312. The concatenation can also be done in the reverse order, so that the thick and narrow suspenders 7311 and 7312 with in-plane transducers are connected to the anchor points, while the thin and wide suspenders 7321 and 7322 are connected to the inertial masses.

The width-to-thickness ratio of suspenders 7321 and 7322, and the thickness-to-width ratio of suspenders 7311 and 7312, may for example be greater than 2. The rigidity of a suspender in a given bending direction is proportional to the third power of the dimension of the suspender in that direction. If the lengths of suspenders 7311 and 7312 are equal to the lengths of suspenders 7321 and 7322, then the width of suspenders 7311 and 7312 should preferably be equal to the thickness of suspenders 7321 and 7322. This produces essentially equal resonant frequencies for the in-plane and out-of-plane modes.

In other words, in the gyroscope illustrated in FIG. 7b, the longitudinal lengths of the first and second suspenders 7312 and 7322 are equal, and the transversal width of the first suspender 7312 is less than its own vertical thickness but equal to the vertical thickness of the second suspender 7322, and the transversal width of the second suspender 7322 is equal to the vertical thickness of the first suspender 7321.

Figure 8:
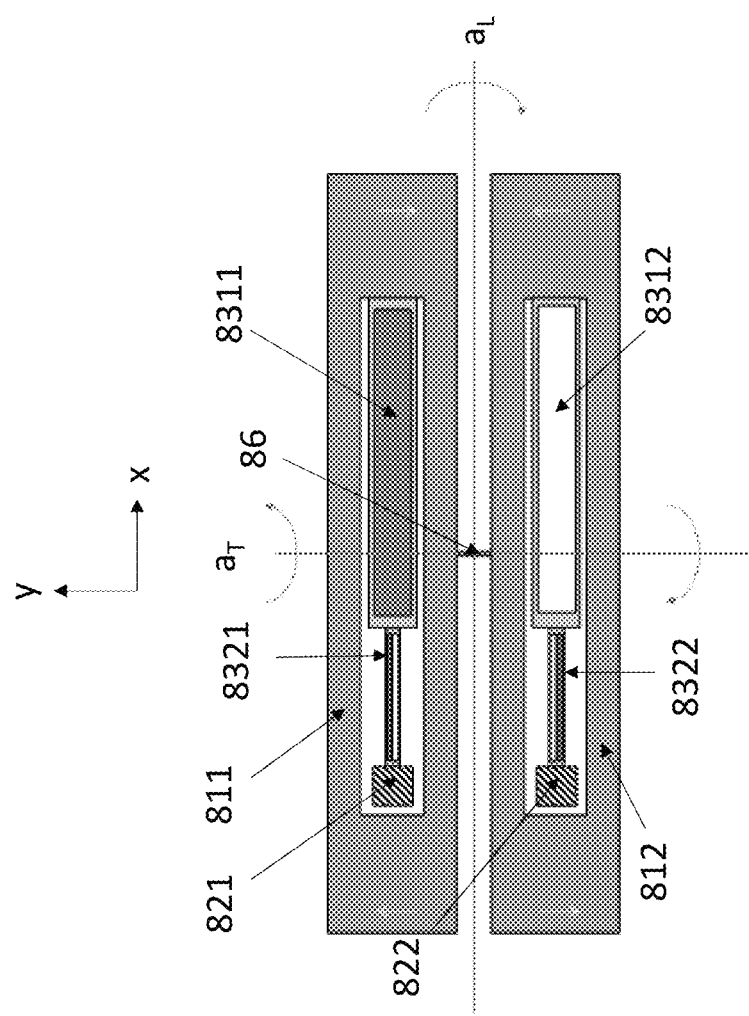
FIG. 8 also illustrates linear suspension structures with two concatenated suspenders.

It may sometimes not be easy or cost efficient to prepare parts with differing thicknesses in the suspension structure, as in the gyroscope illustrated in FIGS. 7a and 7b. However, the coupling of drive oscillation to the sense signal can also be reduced through the mechanism described above by altering only the lengths and widths of the concatenated suspenders, but not their thicknesses. FIG. 8 illustrates a gyroscope where reference numbers 811, 812, 821, 822 and 86 correspond to reference numbers 711, 712, 721, 722 and 76 in FIGS. 7a and 7b. The concatenated suspenders 8311+8321 and 8312+8322 are in this case not equal in their length in the x-direction. Instead, the suspenders 8311 and 8312 which have been coated with out-of-plane transducers are longer than the suspenders 8321 and 8322 which have been coated with in-plane transducers.

The increased length of suspenders 8311 and 8312 increases their stiffness in the in-plane direction, while the decreased length of suspenders 8321 and 8322 increases their stiffness in the out-of-plane direction. This is because the in-plane rotational spring constant $k_{ip}$ of a straight bar is proportional to $w^3h/l$, and the out-of-plane spring constant $k_{op}$ is proportional to $wh^3/l$, where w is the width of the bar, h is the thickness of the bar and l is the length of the bar.

As an illustrative example of suspender design, let's consider a case where a first suspender 1 is used for drive motion in the in-plane direction, and a second suspender 2 is used for sensing the coupled motion in the out-of-plane direction. A necessary requirement for the spring constants is that $k_{IP1}=k_{OP2}$, because the frequencies must match. The target ratio between the spring constants in second suspender 2 may, for example, be $k_{IP2}=9*k_{OP2}$, which would reduce the quadrature signal by a factor of 9. The spring constants in first suspender 1 may be $k_{IP1}=k_{OP1}$, which means that 50% of the coupled motion energy will be in the drive spring and doesn't contribute to the sense signal. Combined with the proportionality relationships mentioned above, these requirements yield the following relationships between suspender dimensions: $w_2=3*h$, $w_1=h$ and $l_2=3*l_1$.

In other words, in this case the vertical thicknesses of the first and second suspenders 8312 and 8322 are equal, and the transversal widths of the first suspender 8312 and second suspender 8322 are different, but the longitudinal length of the first suspender 8312 is greater than that of second suspender 8322. The lengths should be dimensioned so that the in-plane and out-of-plane resonance frequencies of the inertial mass are essentially equal.

Furthermore, it is possible to mix the options illustrated in FIGS. 7a, 7b and 8, so that the concatenated suspenders differ from each other in all three dimensions. However, the resonance frequencies of the orthogonal drive and sense oscillation modes should be maintained essentially equal. In both the gyroscope illustrated in FIGS. 7a and 8, the in-plane transducers may preferably be used for actuating the drive oscillation, and the out-of-plane transducers for detecting the sense oscillation. It is possible to use the out-of-plane transducers for actuation and the in-plane transducers for detection, but it is often easier to generate a large drive amplitude in the in-plane mode. It is also desirable to use the largest possible area for the transducers which measure the sense oscillation to obtain a strong sense signal.

Second Embodiment

Figure 9B:
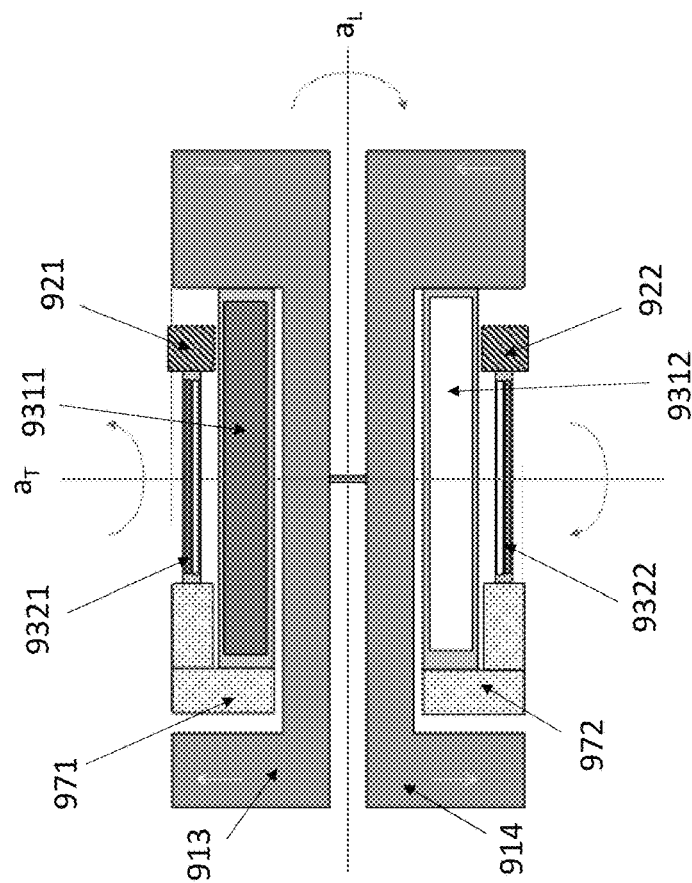
FIGS. 9a and 9b illustrate suspension structures with two concatenated suspenders and a U-turn intermediate body.
Figure 9A:
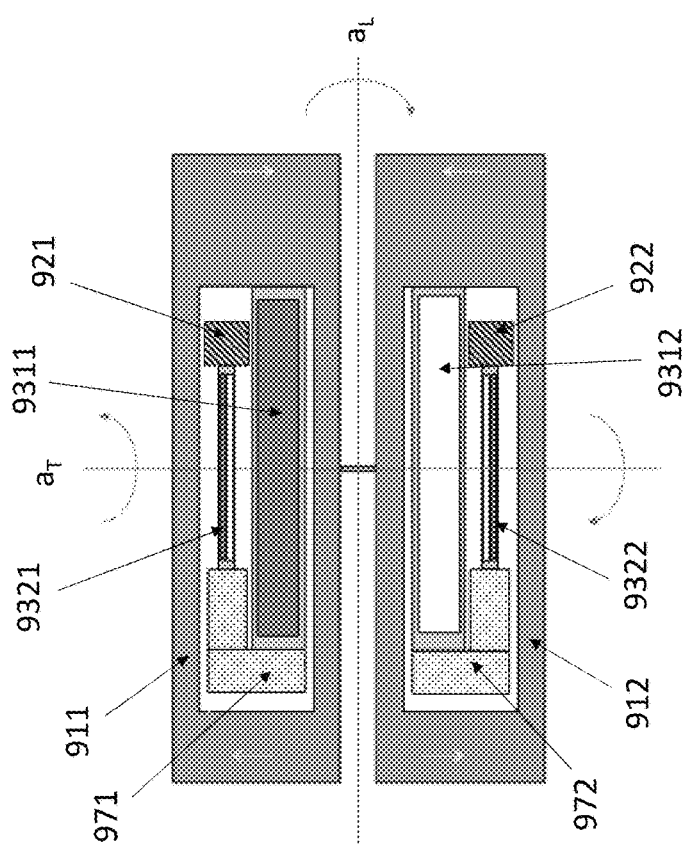

FIGS. 9a and 9b illustrate gyroscopes where the suspension structures comprise the set of first suspenders comprises one first suspender and the set of second suspenders comprises one second suspender, and that the set of first suspenders and the set of second suspenders are concatenated in parallel via a U-turn intermediate body, so that the first suspender extends in a first longitudinal direction along a first longitudinal axis from the anchor point to the intermediate body, and the second suspender extends in the opposite longitudinal direction along a second longitudinal axis from the intermediate body to the inertial mass. In other words, the set of first suspenders comprises only one first suspender, and the set of second suspenders comprises only one second suspender. The transversal symmetry axis of the gyroscope may cross the longitudinal middle of the first suspender and both second suspenders In this disclosure, the expression that a given suspender "extends" in a certain direction refers only to its extension on the path which traverses the suspension structure from the anchor point to the inertial mass, i.e. its extension from the end which lies closer to the anchor point to the end which lies further from the anchor point.

FIG. 9a illustrates a gyroscope where the suspension structure of first inertial mass 911 comprises concatenated suspenders 9311 and 9321. One end of the first suspender 9321 is attached to the anchor point 921 and the other is attached to intermediate body 971. First suspender 9321 extends leftward in FIG. 9a.

The intermediate body is in this case a U-turn intermediate body, in this case formed like the letter L, which allows the path which traverses the suspension structure to make a 180° turn. The parts which constitute the intermediate body 971 have relatively small aspect ratios, as illustrated in FIGS. 9a and 9b. This makes them significantly stiffer in out-of-plane rotation than suspender 9311, and also stiffer in in-plane rotation than suspender 9321.

One end of the second suspender 9311 is attached to the intermediate body 971 and the other is attached to the inertial mass 911. The second suspender 9311 extends to the right in FIG. 9a, so that the first and second suspender extend in opposite longitudinal directions along two parallel longitudinal axes.

The increased in-plane flexibility of first suspender 9321 and increased out-of-plane flexibility of second suspender 9311 can be obtained with either of the arrangements presented in the first embodiment. In other words, in-plane flexibility may be obtained through narrow transversal width, out-of-plane flexibility may be obtained through small vertical thickness, and both of them may be obtained by altering the longitudinal lengths of the suspenders appropriately.

FIG. 9b illustrates a gyroscope with the same component parts as in FIG. 9a. However, the inertial masses 911 and 912 in FIG. 9a have central openings where each anchor point is surrounded by the corresponding inertial mass on all sides. The inertial masses 913 and 914 in FIG. 9b, on the other hand, have a central opening where each anchor point is surrounded by the corresponding inertial mass only on three sides. Inertial masses with this shape can be used in the other embodiments of this disclosure as well.

The transversal symmetry axis $a_T$ of the gyroscope, which crosses the longitudinal middle of both the first and the second suspender in the suspension structure illustrated in FIGS. 9a and 9b, also crosses the effective center of gravity of each inertial mass 911 and 912. This arrangement produces a pure bending moment load at the ends of each suspender when the inertial mass is in pure rotary motion. This in turn produces uniform bending along the length of each suspender and a uniform charge distribution in the transducers on the suspenders. It also cancels the effect of all external vibrations, linear and rotary.

Third Embodiment

Placing multiple suspenders coated with piezoelectric sense transducers parallel to each other, with a lateral distance in between, is an alternative way to reduce coupling between drive oscillation and sense oscillation. The advantage of this arrangement is that the in-plane spring coefficient of the suspension structure can be made very large by increasing the separation between the relatively narrow parallel suspenders without increasing its out-of-plane spring constant. In the previous embodiment the increase in the width of the suspender coated with an out-of-plane transducer also increased its out-of-plane spring constant.

FIG. 10a illustrates a gyroscope according to a third embodiment, where the set of first suspenders comprises one first suspender and the set of second suspenders comprises two second suspenders, and that the set of first suspenders and the set of second suspenders are concatenated in parallel via a double U-turn intermediate body, so that the first suspender extends in a first longitudinal direction along a first longitudinal axis from the anchor point to the intermediate body, and both of the second suspenders extend in the opposite longitudinal direction from the intermediate body to the inertial mass along second and third longitudinal axes. The transversal symmetry axis of the gyroscope may cross the longitudinal middle of the first suspender and both second suspenders. In other words, in this case the set of first suspenders comprises only one first suspender, but the set of second suspenders comprises two second suspenders connected in parallel.

Referring to the upper inertial mass in FIG. 10a, the set of first suspenders comprises the suspender 10311, which coated with an in-plane transducer. Suspender 10311 extends leftward from the anchor point and is connected to intermediate body 1071 at its other end. Intermediate body 1071 has a double U-turn shape, which has been implemented as a T-shape in FIG. 10a, but can also be implemented with other shapes. A double U-turn shape allows the path which traverses the suspension structure to diverge into two different paths which make a 180° turn in opposite directions at the intermediate body. As before, the parts which constitute the intermediate body 1071 have relatively small aspect ratios, which makes them significantly stiffer in out-of-plane rotation than suspenders 10321 and 10322, and also stiffer in in-plane rotation than suspender 10311. This stiffness allows the intermediate body to transmit both forms of rotational oscillation from one set of concatenated suspenders to the other without altering the oscillation.

Two second suspenders, an upper second suspender 10321 and a lower second suspender 10322, form the second set of suspenders. Each of these second suspenders extends from the intermediate body 1071 to the inertial mass 1011 in a rightward direction in FIG. 10a. In other words, the second suspenders 10321 and 10322 extend in the opposite longitudinal directions as the first suspender 10311.

The transversal symmetry axis $a_T$ of the gyroscope again crosses the longitudinal middle of all suspenders in the sets of first and second suspenders, and also the effective center of gravity of each inertial mass 1011 and 1012.

The increased in-plane flexibility of first suspender 10311 and increased out-of-plane flexibility of second suspenders 10321 and 10322 can be obtained with either of the arrangements presented in the first embodiment. In other words, in-plane flexibility may be obtained through narrow transversal width, out-of-plane flexibility may be obtained through small vertical thickness, and both of them may be obtained by altering the longitudinal lengths of the suspenders appropriately.

FIG. 10b illustrates an alternative implementation where the upper second suspender 10321 extends rightward from a first anchor point 10211, and the lower second suspender 10322 extends rightward from a second anchor point 10212. The other ends of both of these second suspenders are connected to intermediate body 1071, which is again a T-shaped body. In this case, the double U-turn shape of intermediate body allows the paths which traverse the suspension structure to converge from two different paths into one single path at the intermediate body. The intermediate body is in turn connected to first suspender 10311, which extends to the inertial mass 1011 in a longitudinal direction which is opposite to the direction in which second suspenders 10321 and 10322 extend.

Figure 10C:
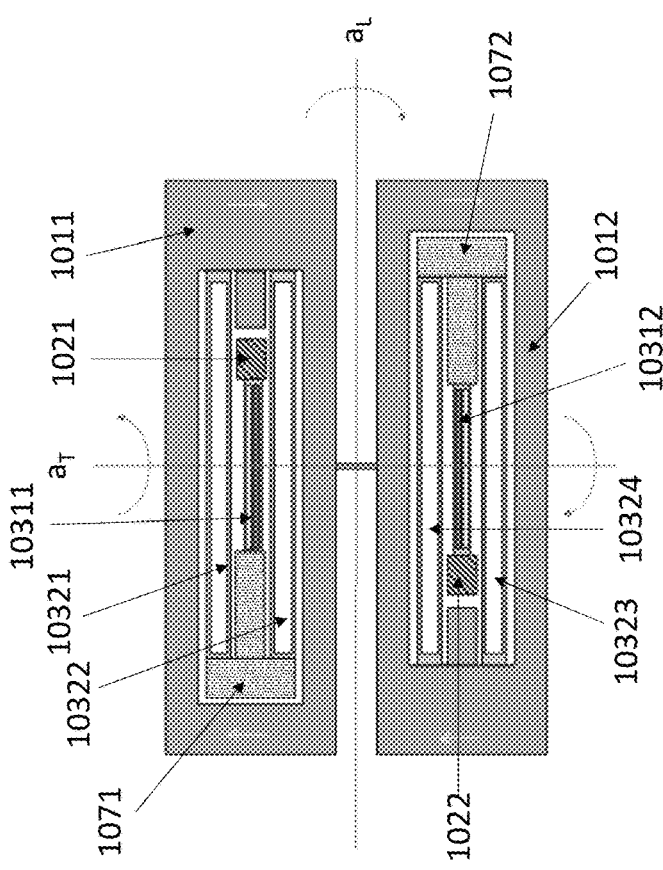

Inertial masses 1011 and 1012 may comprise protrusions 108 which extend into the gap between the second suspenders 10321 and 10322, as illustrated in FIGS. 10a-10c. The purpose of these protrusions is to help in adjusting the location of the combined effective center of gravity (ECOG) of the inertial mass and the suspension structure so that the symmetry axis $a_T$ will coincide with the ECOG and the middle points of the suspenders.

In FIGS. 10a and 10b, the transducers coated on second suspenders 10321 and 10322 in the suspension structure of the first inertial mass 1011 differ in their polarity from the transducers coated on second suspenders 10323 and 10324 in the suspension structure of the second inertial mass 1012. Since the inertial masses 1011 and 1012 oscillate about the transversal symmetry axis $a_T$ in anti-phase oscillation, so that one turns clockwise about this axis when the other turns counter-clockwise, this arrangement facilitates a differential readout of the sense signal where errors due to common mode oscillation, or in other words, in-phase motion of the inertial masses will cancel out. Such common mode motion may arise from external angular vibrations which affect the gyroscope.

However, it also possible to the arrange the suspension structures of the first inertial mass and the second inertial mass asymmetrically in relation to both the transversal and longitudinal symmetry axes of the gyroscope, as illustrated in FIG. 10c where second suspenders 10321 and 10322 extend rightward from intermediate body 1071 to inertial mass 1011, while second suspenders 10323 and 10324 extend leftward from intermediate body 1072 to inertial mass 1012. In this case the clockwise rotation of inertial mass 1011 about the axis $a_T$ bends second suspenders 10321 and 10322 in the same direction as the counter-clockwise rotation of inertial mass 1012 bends second suspenders 10323 and 10324, so that a signal of same polarity is generated to the top electrodes of transducers on both sets of suspenders and a sum of these can be used as the sense signal.

The common mode motion will also be rejected since it will produce signals of opposite polarity to the transducers on the two sets of suspenders and by summing the signal a cancellation of the common mode signal will happen. This configuration doesn't automatically allow symmetrical differential electrical detection, which is preferable for cancellation of electrical cross talk. In this case it can be at least nearly obtained by reversing the roles of top and bottom electrodes of the transducers on one set of suspenders. Perfect electrical symmetry is, however, not possible in this case since the bottom electrode has a large capacitive coupling to the underlying silicon, which the top electrode has not.

Fourth Embodiment

Figure 11A:
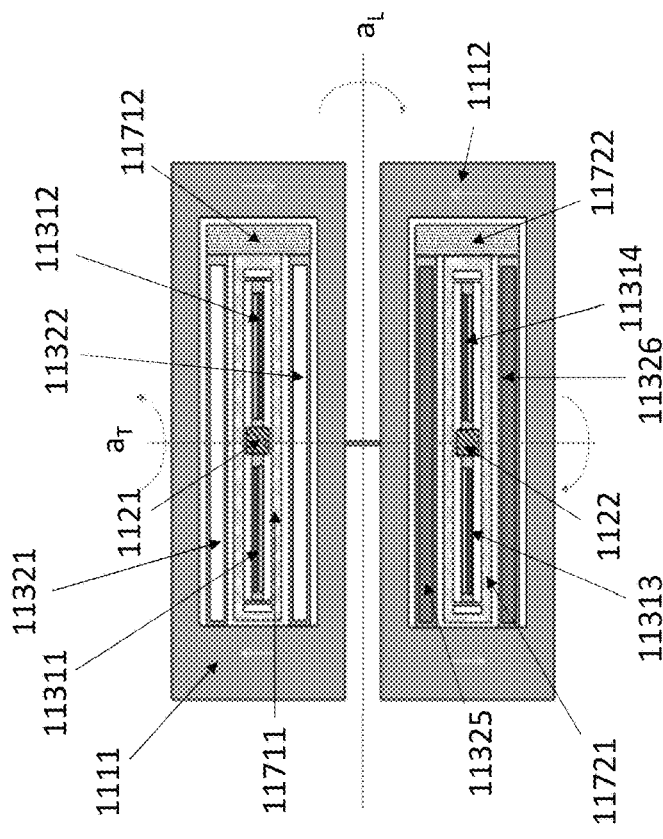
FIGS. 11a-11b illustrate suspension structures with concatenated suspenders and an intermediate body which includes a frame-shaped part.

In the first, second and third embodiments described above, the set of first suspenders comprises only one first suspender. FIG. 11a illustrates an embodiment where the set of first suspenders comprises two first suspenders and the set of second suspenders comprises two second suspenders, and that the set of first suspenders and the set of second suspenders are concatenated in parallel via a frame-and-double U-turn intermediate body which surrounds the anchor point, so that the two first suspenders extend in opposite longitudinal directions, along a first longitudinal axis, from the anchor point to the intermediate body, and the second suspenders both extend in the same longitudinal direction from the intermediate body to the inertial mass along second and third longitudinal axes. The second and third longitudinal axes are situated at the same distance from the first longitudinal axis, but on opposite sides of the first longitudinal axis.

In FIG. 11a, the anchor point 1121 and 1122 in each suspension structure is located on the transversal symmetry axis of the gyroscope ($a_T$). Only the suspension structure which suspends inertial mass 1111 from anchor point 1121 will be described in detail. The suspension structure of inertial mass 1112 is identical, as seen in the Figure. The set of first suspenders comprises two first suspenders 11311 and 11312 which extend longitudinally in two opposite directions from the central anchor point 1121 to the frame-shaped part 11711 of the intermediate body. The anchor point is surrounded by this frame-shaped part 11711 of the intermediate body. The intermediate body also comprises a double U-turn part 11712. Together, the frame-shaped part 11711 and the double U-turn part 11712 resemble the letter T, as seen in FIG. 11a and described in the previous embodiment.

The two first suspenders 11311 and 11312 extend from the anchor point to the frame-shaped part 11711 of the intermediate body. The double U-turn part 11712 of the intermediate body branches the suspension structure close to one longitudinal end of the central opening in the inertial mass into two separate paths, similar to how the intermediate body was utilized in the third embodiment. As before, both parts 11711 and 11712 of the intermediate body are significantly stiffer in out-of-plane rotation than suspenders 11321 and 11322, and also stiffer in in-plane rotation than suspenders 11311 and 11312. This stiffness allows the intermediate body to transmit both forms of rotational oscillation from one set of concatenated suspenders to the other without altering the oscillation.

The first longitudinal axis passes through the anchor point 1121 and the second and third longitudinal axes pass through the two transversal ends of the double U-turn part 11712 of the intermediate body.

The two out-of-plane suspenders 11321 and 11322 may be replaced with one second suspender which has a greater transversal width than the illustrated suspenders 11321 and 11322, in the manner illustrated in FIGS. 9a and 9b. Furthermore, the longitudinal direction in which second suspenders 11321 and 11322 may be opposite to the longitudinal direction which second suspenders 11323 and 11324 extend, in the manner illustrated in FIG. 10c.

Fifth Embodiment

Figures 11B, 11C:
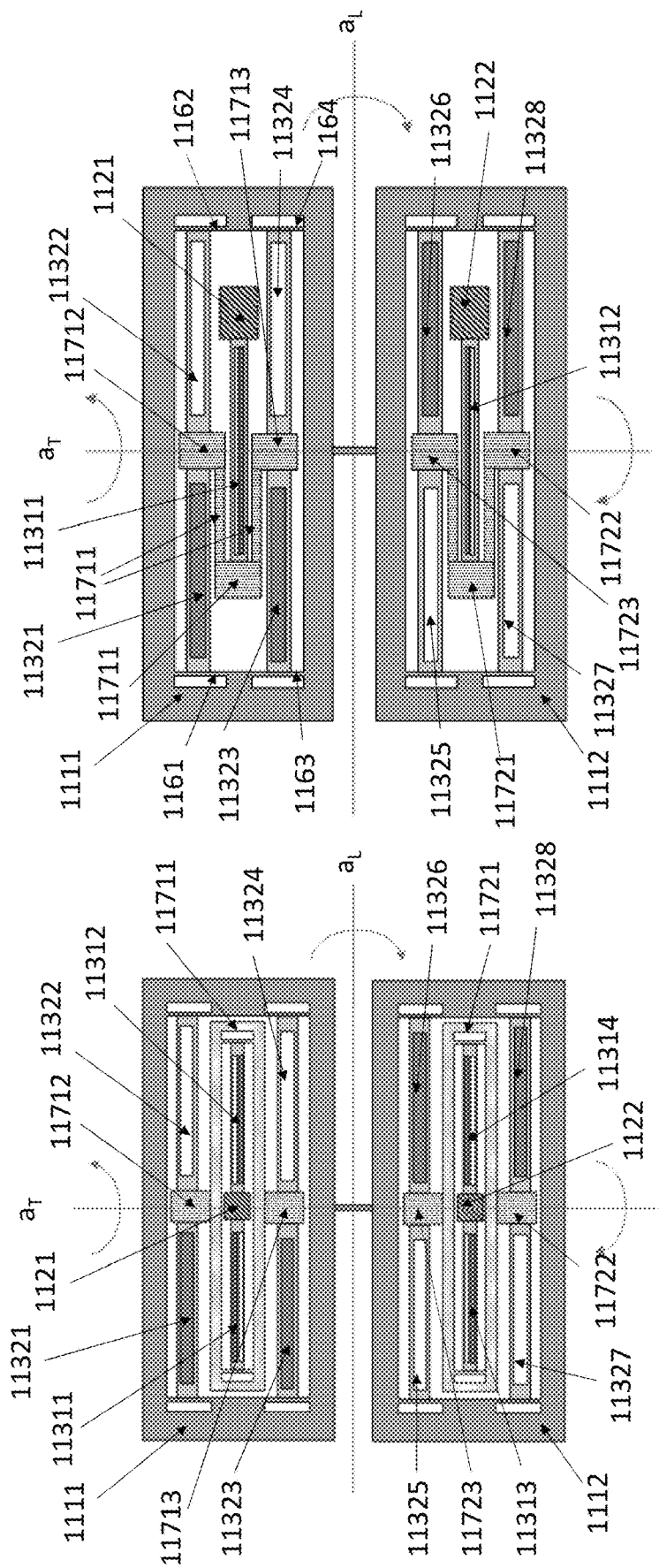
FIG. 11c illustrates suspension structures with concatenated suspenders and an intermediate body which includes a double-U-turn part connected to two T-intersection parts.

FIG. 11b illustrates another embodiment where, in the suspension structure of inertial mass 1111, the intermediate body again comprises a frame-shaped part which surrounds the first anchor point 1121 and first suspenders 11311 and 11312. However, the set of second suspenders in this case comprises four suspenders 11321-11324.

In the illustrated embodiment, the set of first suspenders comprises two first suspenders and the set of second suspenders comprises four second suspenders, and the set of first suspenders and the set of second suspenders are concatenated in parallel via a frame-and-double-T-intersection intermediate body which surrounds the anchor point. The two first suspenders extend in opposite longitudinal directions, along a first longitudinal axis, from the anchor point to the frame-shaped part of the intermediate body. Two second suspenders extend in opposite longitudinal directions from a first T-intersection part of the intermediate body to the inertial mass along a second longitudinal axis. Two further second suspenders extend in opposite longitudinal directions from a second T-intersection part of the intermediate body to the inertial mass along a third longitudinal axis, and the second and third longitudinal axes are situated at the same distance from the first longitudinal axis, but on opposite sides of the first longitudinal axis.

The set of first suspenders in the suspension structure of inertial mass 1111 comprises two first suspenders 11311 and 11312 which extend longitudinally in two opposite directions from the anchor point 1121, which is again located on the transversal symmetry axis $a_T$. The first suspenders extend from the anchor point 1121 to the frame-shaped part 11711 of the intermediate body. However, in this case the intermediate body branches out into multiple paths at the longitudinal center of the gyroscope through two T-intersection parts 11712 and 11713, which extend away from the frame-shaped part 11711 in opposite transversal directions, as illustrated in FIG. 11b.

In this arrangement, second suspenders 11321 and 11322 are arranged on the second longitudinal axis on both sides of the T-intersection part 11712 of the intermediate body, and two further second suspenders 11323 and 11324 are arranged on the third longitudinal axis on both sides of the T-intersection part 11713 of the intermediate body. In other words, the first longitudinal axis passes through the anchor point 1121, and the second and third longitudinal axes pass through the T-intersection parts 11712 and 11713 which extend away from the frame-shaped part 11711 of the intermediate body in opposite transversal directions.

The second suspenders 11321-11324 may be arranged symmetrically in relation the first longitudinal axis and the transversal symmetry axis $a_T$.

Sixth Embodiment

The intermediate body may also comprise a double-U-turn part connected to two T-intersection parts. This alternative is illustrated in FIG. 11c.

In the illustrated embodiment, the set of first suspenders comprises one first suspender and the set of second suspenders comprises four second suspenders. The set of first suspenders and the set of second suspenders are concatenated in parallel via a double-U-turn-and-double-T-intersection intermediate body. The first suspender extends in a first longitudinal direction, along a first longitudinal axis, from the anchor point to the double-U-turn part of the intermediate body. Two second suspenders extend in opposite longitudinal directions from a first T-intersection part of the intermediate body to the inertial mass along a second longitudinal axis. Two further second suspenders extend in opposite longitudinal directions from a second T-intersection part of the intermediate body to the inertial mass along a third longitudinal axis. The second and third longitudinal axes are situated at the same distance from the first longitudinal axis, but on opposite sides of the first longitudinal axis.

Focusing again only on the suspension structure of inertial mass 1111, the set of first suspenders comprises in this case only suspender 11311, which extends from the anchor point 1121 to the double-U-turn part 11711 of the intermediate body. The double U-turn part branches into two separate branches which extend to the transversal symmetry axis $a_T$ of the gyroscope. The two T-intersection parts 11712 and 11713 of the intermediate body should preferably be located on the transversal symmetry axis, because this allows the second suspenders 11321 and 11323 on one side of the transversal symmetry axis to have the same length as the second suspenders 11322 and 11324 on the other side of the transversal symmetry axis. On the transversal symmetry axis, the two T-intersection parts 11712 and 11713 of the intermediate body extend away from the double-U-turn part 11711 of the intermediate body in two opposite transversal directions, as illustrated in FIG. 11c.

If the first suspender 11311 would extend only from the anchor point 1121 to the transversal symmetry axis, then the double-U-turn part 11711 of the intermediate body could be replaced with a T-intersection. However, it is preferable to increase the length of the first suspender 11311 so that it crosses the transversal symmetry axis as illustrated in FIG. 11c, and a double-U-turn part is then needed in the intermediate body to concatenate the first spring 11311 with the second springs 11321-11324, all of which extend to the transversal symmetry axis.

In this arrangement, second suspenders 11321 and 11322 are arranged on the second longitudinal axis on both sides of T-intersection part 11712 in the intermediate body, and two further second suspenders 11323 and 11324 are arranged on the third longitudinal axis on both sides of T-intersection part 11713 in the intermediate body. In other words, the first longitudinal axis passes through the anchor point 1121, and the second and third longitudinal axes pass through the T-intersection parts 11712 and 11713, which extend away from the double-U-turn part 11711 of the intermediate body in opposite transversal directions.

Seventh Embodiment

The number of anchor points from which the suspension structure suspends the inertial mass may be larger than one. This facilitates the addition of suspenders specifically dedicated to providing structural support to the inertial mass. The inclusion of one or more supportive suspenders opens up new design options for the sets of first and second suspenders which are used for driving and sensing purposes.

FIG. 12 illustrates and embodiment where the set of first suspenders comprises one first suspender and the set of second suspenders comprises two second suspenders. The set of first suspenders and the set of second suspenders are concatenated in parallel from a first anchor point via an E-intersection intermediate body, so that the first suspender extends in a first longitudinal direction, along a first longitudinal axis, from the first anchor point, to a transversal end of the E-intersection intermediate body. The first suspender is flexibly attached to a transversal end of the E-intersection intermediate body. Two second suspenders extend in a second longitudinal direction, opposite to the first longitudinal direction, from the E-intersection intermediate body to the inertial mass along second and third longitudinal axes. A supportive suspender extends in the first longitudinal direction along a fourth longitudinal axis from a second anchor point to the E-intersection intermediate body. The second and third longitudinal axes are situated on opposite sides of the fourth longitudinal axis. The in-plane spring constant of the supportive suspender is much smaller than the in-plane spring constant of the set of first suspenders, and the out-of-plane spring constant of the supportive suspender is much greater than the out-of-plane spring constant of the set of second suspenders.

Focusing again only on the suspension structure of inertial mass 1211 in the embodiment illustrated in FIG. 12, a first anchor point 12211 is located adjacent to the inertial mass 1211. The inertial mass has a central opening where a second anchor point 12212 is surrounded by inertial mass 1211 on three sides. The structural support required by the inertial mass 1211 is provided from second anchor point 12212 through supportive suspender 1241, while the first anchor point 12211 merely fixes one end of first suspender 12311.

The supportive suspender 1241 may be very narrow and short, with no piezoelectric transducers coated upon it. The supportive suspender 1241 may be thick in the z-direction, and due to its shortness in the longitudinal direction, it will be stiffer in out-of-plane bending than the second suspenders 12321 and 12322 are together. In other words, the out-of-plane spring constant of the supportive suspender 1241 is much greater than the out-of-plane spring constant of the set of second suspenders. The bending motion which results from the out-of-plane movement of the inertial mass 1211 will therefore be concentrated in the second suspenders.

On the other hand, due to its narrowness in the transversal direction, the supportive suspender 1241 will be more flexible in in-plane bending than first suspender 12311. In other words, the in-plane spring constant of the supportive suspender is much smaller than the in-plane spring constant of the set of first suspenders. It will therefore not prevent the in-plane oscillation of the inertial mass. The first suspender 12311 is attached to intermediate body 1271 with a flexure 1251 which is thin in the x-direction. When the first suspender drives the inertial mass into in-plane oscillation, the second suspenders 12321 and 12322 and the intermediate body 1271 will transmit the in-plane oscillation to the inertial mass 1211 without dampening it significantly. The in-plane resonant frequency of the system is determined by the first suspenders and the moment of the inertia of the inertial body. The supportive suspender 1241 has only a minor effect on the resonant frequency or amplitude of the oscillation.

The intermediate body has a shape which resembles the letter E. In this arrangement, if when the first suspender 12311 lies on a first longitudinal axis, second suspender 12321 lies on a second longitudinal axis which crosses one transversal end of the E-intersection intermediate boy (the topmost part of the intersection in the plane of FIG. 12). The other second suspender 12322 lies on a third longitudinal axis which crosses the other transversal end of the E-intersection intermediate body (the lowest part of the intersection in the plane of FIG. 12). The supportive suspender 1241 lies on a fourth longitudinal axis which crosses the midpoint of the E-intersection intermediate body. The fourth longitudinal axis passes through the second anchor point 12212, and the second and third longitudinal axes pass through the opposite transversal ends of the E-intersection intermediate body.

Complementary Embodiments

The bending mode of a suspender connected to an inertial mass depends on the resonance frequency of the inertial mass, on the dimensions of the suspender and the voltage applied to the transducer on top of it, and on how the suspender is attached to the oscillating inertial mass. In resonance oscillation, the bending mode of a given suspender will be the same regardless of whether the transducer on the suspender is used for driving or sensing. The inertial mass forces the suspender to assume the bending mode which corresponds to its resonance oscillation.

In other words, although the mechanical actuation of the drive transducer and the force arising from the resonating inertial mass always act together and bend the suspender together, the force arising from the resonating inertial mass is far stronger than an actuating drive force when the inertial mass oscillates in resonance. The bending mode must adapt to the resonance motion.

When the bending of a suspender is dictated by the movement of the inertial mass, the bending mode of the suspender does not necessarily exhibit uniform curvature along the entire length of the suspender.

Figure 14:
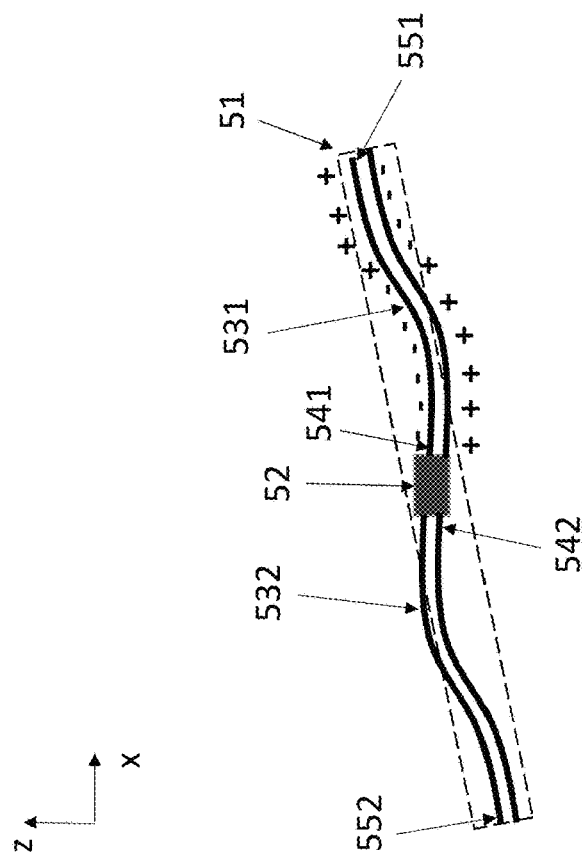
FIG. 14 illustrates the bending mode of a suspender in a two-sided arrangement.

This is illustrated in FIG. 13 for the suspender 631 in FIG. 6 in out-of-plane oscillation. The suspender 631 bends when the inertial mass 611 undergoes out-of-plane rotation about the y-axis. Inflexible attachment at second attachment point 651 may force the outer end of the suspender to move as a guided end. This makes the suspender 631 assume an S-shaped form which creates a sign reversal of the surface stress of the suspender, and thus a sign reversal in the charge between the sides of the corresponding transducers between attachment points 641 and 651, as illustrated in FIG. 13. The signs in FIG. 13 represent the sign of the surface stress along the suspender on each side of it. If the upper surface of the suspender is coated by the transducer, the signs can also signify the sign of the charge at each side of the transducer. The illustrated bending mode is not optimal because the sense voltage signal is lowered when charges of opposite sign cancel each other out in each sense electrode, and the signal-to-noise ratio will be lowered. FIG. 14 illustrates the same problem for the suspender 531 in FIG. 5 in out-of-plane oscillation. The same problem occurs in in-plane oscillation in both arrangements.

Inflexible attachment and S-shaped bending can make the relationship between external force and suspender displacement non-linear, so that the bending is not characterized by a single spring constant. In case of a drive transducer and high amplitude oscillation produced at resonance, the non-linearity will lower the resonant frequency of oscillation when the amplitude is increased. Also, the energy losses will increase and the effective Q-value will thus decrease due to the nonlinearity, since part of the energy of the oscillation is irreversibly converted to higher harmonic frequencies. The S-shape bending mode also leads to high spring constant values, which may sometimes necessitate larger inertial masses.

To alleviate these problems, it can be beneficial to set the inertial mass to vibrate in a rotary mode which approximates pure rotation as closely as possible. In pure rotation, only a pure bending moment is imparted to the suspender attached to the inertial mass, and the suspender bends with uniform curvature.

In suspension structures which include two-sided arrangements where two suspenders extend in opposite directions from an anchor point or an intermediate body, as in FIGS. 14 and 11a-11b, the bending mode of these suspenders can be improved by preparing a flexure at the attachment point where they are attached to the inertial mass. Flexures 1161-1164 have been enumerated in FIG. 11c and corresponding flexures are illustrated in both inertial masses 1111 and 1112 in all FIGS. 11a-11b.

An exemplary gyroscope may comprise a substrate with at least one anchor point and an inertial mass with a first longitudinal end and a second longitudinal end. The inertial mass may be suspended from the at least one anchor point by a suspension structure which includes two first suspenders extending in opposite longitudinal directions from the at least one anchor point to a frame-shaped part of an intermediate body. Each first suspender may be attached from a first attachment point to its anchor point and from a second attachment point to the frame-shaped part of the intermediate body. One or more first suspenders may be coated with a piezoelectric transducer structure configured to drive or detect oscillating rotary movement in the inertial mass, and these coated suspenders may be attached from the second attachment point to the intermediate body with a flexure.

The same suspension structure may comprise second suspenders which extend in opposite longitudinal directions from one or more parts of the intermediate body to the inertial mass. The second suspenders may be attached from a first attachment point to the intermediate body and from a second attachment point to the inertial mass. One or more second suspenders may be coated with a piezoelectric transducer structure configured to drive or detect oscillating rotary movement in the inertial mass, and these coated suspenders may be attached from the second attachment point to the inertial mass with a flexure.

Flexures can be implemented in a suspension structure only for the first suspenders (FIG. 11a), or for both first and second suspenders (FIG. 11b), or only for the second suspenders (FIG. 11c).

The term "flexure" refers to an etched silicon structure which is sufficiently flexible to absorb, by bending or twisting, the bending moment acting between the inertial mass and the suspender. For example, flexures 1161-1164 in FIG. 11c may reduce the bending moment between suspenders 11321-11324 and the inertial mass 1111 approximately to zero. Flexures thereby reduce the charge distribution disparity between the two sides of the sense transducer by removing the sign reversal of the surface stress and thus that of the charge.

The height of a flexure in the z-direction may be designated $Z_F$. This height may equal the thickness of the inertial mass and the suspenders. In some practical configurations, these heights are on the order of 50 μm.

Figure 15A:
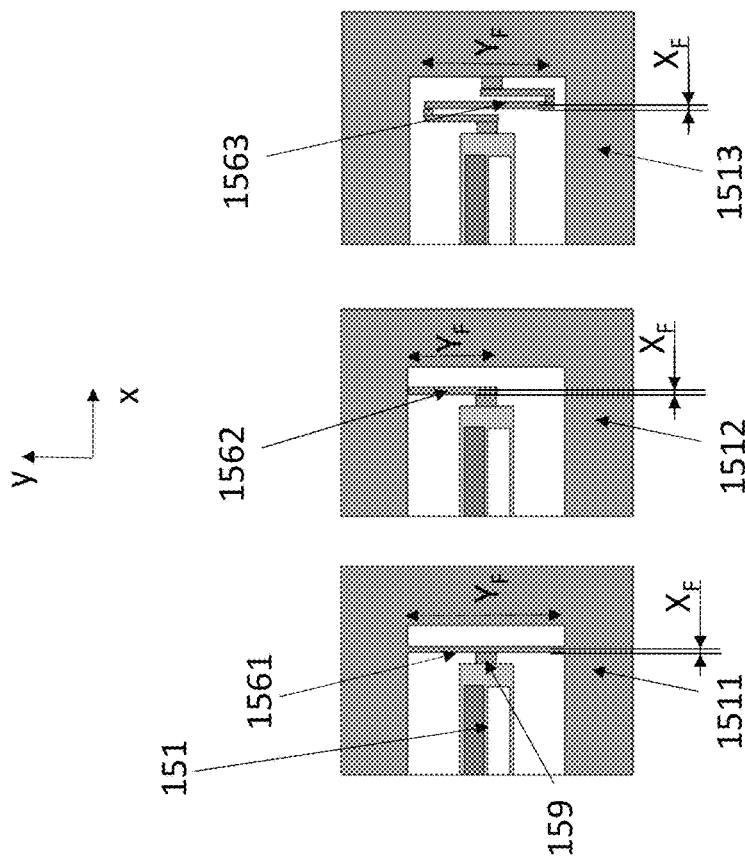

$Y_F$ denotes here the length of the flexure in the y-direction. FIG. 15a illustrates three exemplary flexures. The flexure 1561 spans the breadth of the central opening in the inertial mass 1511. The flexure 1562 spans half of the breadth of the central opening in the inertial mass 1512. The flexure 1563 has a meandering shape with a length $Y_F$ which exceeds half of the breadth of the central opening in the inertial mass 1513. The width of the central opening in an inertial mass near the attachment point may, for example, be 30-70% of the width of the inertial mass 1511, 1512, 1513. $X_F$ is the breadth of the flexible spring in the x-direction. Any of the flexures presented in FIG. 15a can be employed in the embodiments presented in this disclosure.

The thickness $Z_F$ of flexures makes them stiff for translational movement out of the xy-plane. Their narrow breadth $X_F$ allows them to flex in the xy-plane when in-plane bending of the inertial mass is transmitted to the suspender, and to twist torsionally about the y-axis when the out-of-plane movement of the inertial mass is transmitted to the suspender.

In other words, the flexures are stiff for translational movement out of the mass plane but flexible for bending in the mass plane, and flexible for torsional twisting about an axis which is parallel to the lengthwise direction of the flexure.

The $Z_F/X_F$ and $Y_F/X_F$ aspect ratios determine to what extent the flexure can absorb the bending moment at the attachment point. Large aspect ratios facilitate easy bending and twisting, but $X_F$ must remain sufficiently large to be easy to manufacture and to allow the flexure to withstand the mechanical strain which arises in the bending and twisting. The aspect ratios therefore have optimal lower and upper limits.

In the case of the meandering flexure 1563 in FIG. 15a, the relevant aspect ratios may be calculated as $Z_F/X_F$ and $\Sigma Y_F/X_F$, where $\Sigma Y_F=Y_{51}+Y_{52}+Y_{53}$ ... is the sum of the lengths of all components of the meandering flexure in the y-direction.

The $Z_F/X_F$ aspect ratio may be called height/breadth aspect ratio, and the $Y_F/X_F$ and $\Sigma Y_F/X_F$ aspect ratios may be called length/breadth aspect ratios.

Partial absorption of the bending moment at the second attachment point may be achieved when the height/breadth and length/breadth aspect ratios equal to 2. Almost complete absorption of the bending moment may be achieved when the height/breadth and length/breadth aspect ratios are greater than 4. The height/breadth aspect ratio can be increased up to 10 without compromising manufacturability or stress durability. The length/breadth aspect ratio doesn't have such a manufacturing limit or strength limit but the length of the flexure must be much less than the suspension length so that the total spring coefficient is not influenced. The height/breadth aspect ratio greater than 10 will absorb all the bending moment at the second attachment point, but the manufacturability suffers and stress durability becomes weaker, and it may cause yield loss and decrease of the shock resistance.

The mechanics of flexing and twisting movement in the flexures depend on their dimensions and on the dimensions of the second attachment points. This is illustrated schematically in FIGS. 15b-15d, where the flexure 1561 in FIG. 15a has been drawn. In this case the flexure 1561 is as thick as the inertial mass in the z-direction, so the flexure 1561 is attached to the inertial mass 1511 from 1581 to 1582 and from 1571 to 1572. 159 is an optional narrow silicon bridge at the end of the suspender 1531. The suspender 1531 could also be attached to the flexure along its entire breadth, without a narrow bridge.

FIG. 15c illustrates schematically the bending of the flexure 1561 when the inertial mass undergoes in-plane rotation, viewed in the xy-plane. The width of the second attachment point has been exaggerated to improve clarity, and the angle of rotation indicated in FIG. 15c is for the same reason much larger than the angle an inertial mass would normally obtain in a MEMS resonator. The flexure 1561 remains attached to the moving inertial mass at points 1571-1572 and 1581-1582, but bends at the middle so that no bending moment is transferred from the inertial mass to the second attachment point 1551-1552 and onward to the suspender 1531.

FIG. 15d illustrates schematically the bending of the flexure 1561 when the inertial mass has undergone out-of-plane rotation clockwise about the y-axis, viewed from the same angle as in FIG. 15b. The flexure 1561 becomes torsionally twisted about the y-axis, so that the upper edge and the lower edge move in different directions on the x-axis. At both ends of the flexure 1561, the upper corners 1571, 1581 of the flexure remain aligned with the lower corners 1572, 1582. The angle of rotation indicated in FIG. 15d is larger than the rotation angle which an inertial mass would normally obtain in a MEMS resonator. The flexure 1561 twists at the middle, so that no bending moment is transferred from the inertial mass to the suspender 1531. The suspender 1531 is illustrated with an in-plane transducer in FIG. 15a, but it would be coated with an out-of-plane transducer when that is the intended rotation mode.

The technical effect of torsional twisting in flexures is illustrated in FIG. 16. For reasons of clarity the flexures 1661, 1662 have been illustrated only with a black dot and the suspenders 1631, 1632 have been drawn relatively thin, even though both flexures and suspenders may be as thick as the inertial mass 161 in the z-direction. The torsional twist in the flexures 1661, 1662 allows the suspenders 1631 and 1632 to assume a shape where the curvature is in the same direction along the entire length of the suspenders.

Consequently, the surface stress on the suspender and thus the accumulated charge on either side of the transducer has the same sign along the entire length of the suspender. This allows the inertial mass to be driven more effectively, and it conversely allows a stronger sense signal to be detected in the sense mode with simplified transducer geometry. The transducer is strongly coupled to the bending mode of the suspender for most of its length, and the suspender oscillation is linear even in large displacements. Linearity facilitates an increase in the oscillation amplitude of the inertial mass without increased mechanical losses or a change in oscillation frequency.

In other words, the advantages obtained with flexures include transducer charge distributions which exhibit no sign reversal along the length of the suspender, suspender bending modes with low spring constants, and consequently high piezoelectric transducer capacitances and small size of the resonator at a given resonant frequency. In gyroscopes these benefits facilitate small motional resistance, high coupling factors, reliable and fast startup of the oscillation and high signal-to-noise ratios in the sense voltage signal. The flexures also facilitate stress relief in the suspenders because they flex in the lengthwise direction of the suspender (in the x-direction in FIG. 16), which greatly improves the linearity of the resonator.

The same surface stress, charge distribution, stress relief and linearity considerations apply to the resonator and suspenders in FIG. 16 when the inertial mass 161 is driven into in-plane rotation about the z-axis.

As illustrated graphically in FIG. 16, the charge density in the transducer may be higher close to the first attachment point 1641 than it is near the second attachment point 1651 in the illustrated bending mode. In other words, the suspender 1631 may bend with a larger curvature close to the first attachment point 1641 than it bends close to the second attachment point 1651. It may for this reason be beneficial to shorten the transducer on the suspender 1631 so that it covers, for example, 50-70% of the length of the suspender, starting from the end which is closer to the first attachment point. In other words, the piezoelectric transducer structure on at least one coated suspender may extend along the suspender from the first attachment point to a point whose distance from the first attachment point corresponds to 50-70% of the length of suspender.

Additional benefits can be gained if the combined effective center of gravity of the inertial mass and the suspension structure coincides, or at least approximately coincides, either (in the case of out-of-plane oscillation) with the rotational axis of the inertial mass or (in the case of out-of-plane oscillation) with a transversal line which crosses the rotational axis of the inertial mass.

If a coated suspender in a suspension structure has an even transversal breadth and vertical height profile, and if the geometry of the suspension structure allows the coated suspender to be placed approximately symmetrically in relation to the transversal symmetry axis $a_T$, then the longitudinal distance from either end of the coated suspender to the transversal line which passes through the effective center of gravity of the inertial mass may, for example, be 0.4-0.6 times, or 0.49-0.51 times, the length of the coated suspender. When the rotation axis of the inertial mass coincides with the center of gravity, such suspenders experiences a constant bending moment at all locations. All coated suspenders in FIGS. 9a-9b, 10a-10c, 12 and 18, and the suspenders coated with out-of-plane transducers in FIG. 11a, and the suspenders coated with in-plane transducers in FIG. 11c, are suspenders of this kind. However, this optimization is not applicable to the other coated suspenders illustrated in this disclosure.

The term "effective center of gravity" refers to the fact that the inertial mass and the suspension structure move together, and the weight of the suspension structure may not be negligible in comparison to the weight of the inertial mass. However, since one end of the suspension structure is fixed to an anchor point, only part of the suspension structure will contribute a mobile mass component to the oscillating motion. Balanced rotation around a rotation axis requires that the combined effective center of gravity of the suspension structure and the inertial mass lies on, or at least close to, the rotation axis. The effective center of gravity must be calculated with a physical model.

Figure 17:
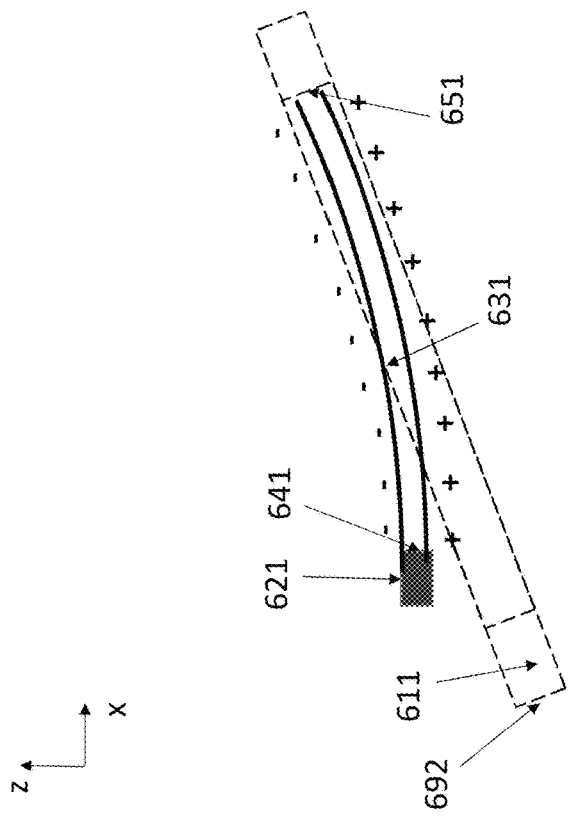
FIG. 17 illustrates the calculation of the effective center of gravity.

The term "effective" refers, firstly, to the fact that the additional mass contributed by the suspension structure to the total mobile mass varies as a function of its degree of bending. FIG. 17 illustrates the out-of-plane bending of suspender 631 in FIG. 6. The mobile weight which is added to the resonator due to the movement of the suspender 631 may be modelled as an effective mass located at the second attachment point 651 where the suspender is attached to the inertial mass. This calculated correction takes into account the additional mass which becomes mobile due to the kinetic energy of the partly moving suspender and added kinetic energy due to the possible flexibility of the inertial mass.

Secondly, the term "effective" also refers to the fact that the inertial mass may not be entirely rigid in its longitudinal direction, and an additional weight component dependent on the degree of bending may have to be calculated to take this flexibility into account, especially in out-of-plane oscillation. For example, in the inertial masses depicted in FIG. 17, the portion of the inertial mass 611 which is close to the second longitudinal end H92 of the inertial mass (and far from second attachment point 651 where the suspender is attached to the inertial mass) may bend slightly away from the longitudinal symmetry line of the inertial mass when the inertial mass oscillates. The mobile weight which is added to the resonator by this bending may be modelled as an effective mass located at the second longitudinal end H92.

When the translational forces imparted by the inertial mass 611 on the coated suspender 631 at the second attachment point zero or very close to zero, the bending mode can be characterized as nearly pure rotation. The inertial mass 611 imparts only a bending moment to the suspender 631 at the second attachment point 651 as it oscillates in resonance. This motion bends the suspender 631 into a parabolic shape, because the local radius of curvature of the suspender 631 is proportional to the local bending moment, and the local bending moment is constant along the length of the suspender 631 when it is fixed at the first attachment point 641 and turned only by a bending moment at the second attachment point 651. A strong sense signal can then be read from a sense transducer on the suspender 631 because charge accumulation is uniform along its entire length, as illustrated in FIG. 17.

The same effects influence the location of the effective center of gravity in more complicated suspension structures which include concatenated suspenders. If the combined effective center of gravity of the inertial mass and the suspension structure is on the rotation axis of the inertial mass (in out-of-plane rotation) or the transversal line which crosses the rotation axis (in in-plane rotation), then the inertial mass will impart a pure bending moment to the suspension structure at the attachment point(s) where the suspension structure is attached to the inertial mass. This pure bending moment load will be transmitted in the suspension structure to the suspender which is flexible for the imparted bending mode. Suspenders and intermediate bodies which are rigid in this bending mode will not influence the bending moment.

Displacing the effective center of gravity (ECOG) from the rotation axis (RA) makes the resonator more sensitive to external disturbances. The rotation axis of the inertial mass is transversal, in other words parallel to the y-axis, in out-of-plane bending. A longitudinal distance, hereafter referred to as the ECOG-RA distance, can in this case be measured from the transversal line which passes through the effective center of gravity to the rotation axis (RA). When the resonator oscillates in-plane, the rotation axis of the inertial mass is parallel to the z-axis. In this case the ECOG-RA distance can be measured from the transversal line which passes through the effective center of gravity (ECOG) of the resonator to the transversal line which passes through the rotation axis (RA) of the inertial mass.

If the ECOG-RA distance is nonzero and an out-of-plane resonator is exposed to external linear vibration, then the inertial mass will experience a torque about its rotation axis. If the resonator is utilized in a gyroscope coupled to another resonator in differential mode, the torque will force both inertial masses to rotate in the same direction about their rotation axis, and the output signal disturbances created by the linear vibration shock in the two transducers will cancel each other. However, if the signal is too large it may overload the common mode capability of the input amplifier. Any asymmetry in the transducers, due to e.g. manufacturing tolerances, will produce a differential signal which is amplified as the output signal of the gyroscope. If, on the other hand, the ECOG-RA distance is nonzero and the same gyroscope is exposed to external rotational vibration about its longitudinal axis, then the torque will force the two inertial masses to rotate in opposite directions and the output signal disturbances will be added to each other. The disturbance cannot in this case be separated from the output signal due to the Coriolis force.

The ECOG-RA distance, which causes the disturbing torque, should preferably be minimized, but it may not always be possible to reduce it exactly to zero due to restrictions posed by manufacturing tolerances. Furthermore, as explained above, the effective center of gravity in out-of-plane oscillation may not exactly coincide with the effective center of gravity in in-plane oscillation, so the ECOG-RA distance may not be reducible to zero for both rotation modes in an inertial mass which is configured to undergo in-plane and out-of-plane oscillation simultaneously.

In any of the preceding embodiments, the inertial masses in a gyroscope may be mechanically coupled to each other and with a more complex synchronization structure than the simple synchronization spring illustrated in FIGS. 7a-12. Such synchronization structures may, for example, be needed for suppressing common-mode oscillation, where both inertial masses oscillate in the same phase.

Figure 18:
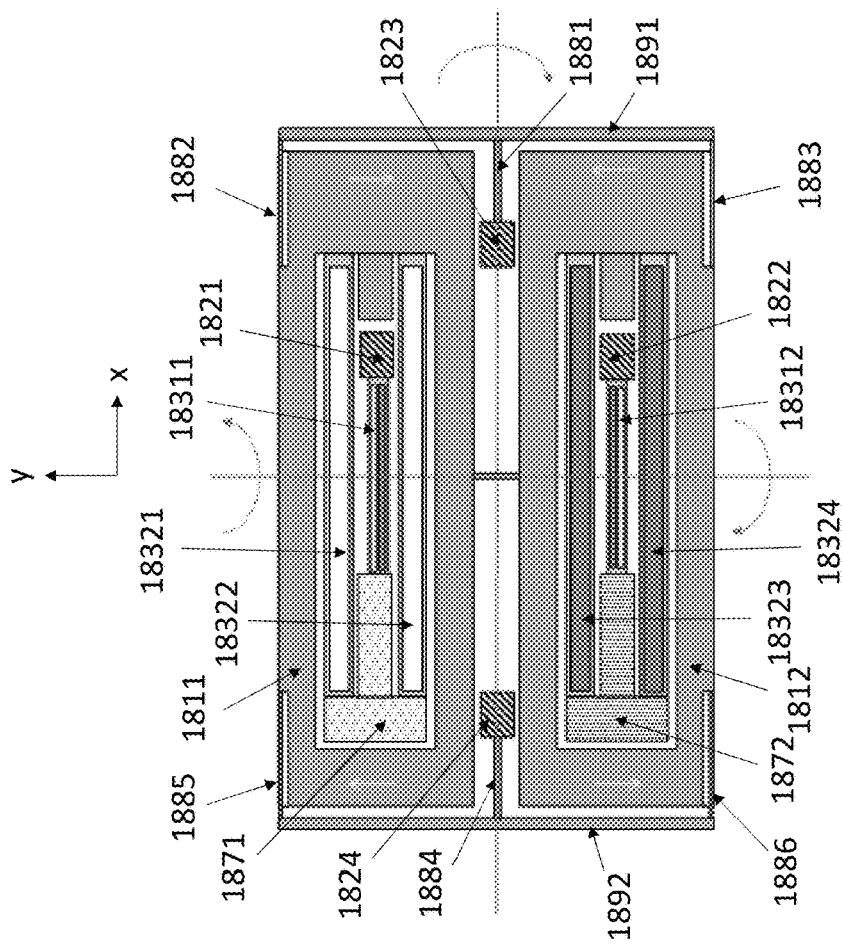
FIG. 18 illustrates a gyroscope with an alternative synchronization structure.

In the exemplary gyroscope illustrated in FIG. 18, the two inertial masses 1811 and 1812 are mechanically coupled and synchronized with a spring system which comprises a third anchor point 1823 between the first and second inertial masses, a first longitudinal spring 1881 extending from the third anchor point to a first transversal bar 1891, a second longitudinal spring 1882 extending from the first transversal bar 1891 to the first inertial mass 1811, and a third longitudinal spring 1883 extending from the first transversal bar 1891 to the second inertial mass 1812. The spring system may also comprise a fourth anchor point 1824 between the first and second inertial masses, a fourth longitudinal spring 1884 extending from the fourth anchor point 1824 to a second transversal bar 1892, a fifth longitudinal spring 1885 extending from the second transversal bar 1892 to the first inertial mass 1811, and a sixth longitudinal spring 1886 extending from the second transversal bar 1892 to the second inertial mass 1812.

The spring system may comprise a synchronization structure at only one longitudinal end of the inertial masses, or at both ends. The latter alternative is illustrated in FIG. 18.

In the example illustrated in FIG. 18, the first inertial mass 1811 is suspended from a first anchor point 1821 with a suspension structure which includes first suspender 18311, intermediate body 1871 and second suspenders 18321 and 18322. The second inertial mass 1812 is suspended from a second anchor point 1822 with a suspension structure which includes first suspender 18312, intermediate body 1872 and second suspenders 18323 and 18324. However, the synchronization structure shown in FIG. 18 can be implemented with any suspension structure described in the preceding embodiments.

In FIG. 18 the spring system which forms the synchronization structure comprises additional central anchor points 1823 and 1824, to which one end of first and fourth longitudinal springs 1881 and 1884 may be attached. The other end of the first and fourth longitudinal springs 1881 and 1884 may be attached to first and second transversal bars 1891 and 1892, respectively. A second longitudinal spring 1882 may be attached from one end to the first transversal bar 1881 and from its other end to the first inertial mass 1811. A third longitudinal spring 1883 may be attached from one end to the first transversal bar 1881 and from its other end to the second inertial mass 1812. A fifth longitudinal spring 1885 may be attached from one end to the second transversal bar 1882 and from its other end to the first inertial mass 1811. A sixth longitudinal spring 1886 may be attached from one end to the second transversal bar 1882 and from its other end to the second inertial mass 1812.

The second, third, fifth and sixth longitudinal springs 1882-1883 and 1885-1886 may be attached to the side of the inertial masses 1811-1812 which lies opposite to the third and fourth anchor points, respectively. This is illustrated in FIG. 18. Alternatively, the second, third, fifth and sixth longitudinal springs 1882-1883 and 1885-1886 may be attached to the inertial masses 1811-1812 closer to the longitudinal middle line of each inertial mass.

The springs 1881-1886 and the transversal bars 1891-1892 are narrow in one direction, as illustrated in the Figure. The higher their aspect ratio, the more efficient the suppression of the common mode. High aspect ratios are also preferable because synchronization will affect the total spring constant of the desired oscillation modes less when the aspect ratio is high. The aspect ratio of the springs and the transversal bars may preferably be in the range 8-12, but even an aspect ratio of 3.4 suppresses common mode oscillation significantly without changing the spring constant by more than 10%.

The longitudinal springs 1881-1886 may have flexibility for in-plane bending and twisting about the x-axis, but are stiff for out-of-plane bending. The transversal bars 1891-1892 may be stiff for all bending and twisting modes, but they may also be given some flexibility for in-plane bending. Flexibility for in-plane bending may be needed especially if the points of attachment of springs 1882-1883 and 1885-1886 do not lie on the longitudinal middle line of each inertial mass. Flexibility in the transversal bar may also improve the linearity of the in-plane spring action.

The invention claimed is:

1. A microelectromechanical gyroscope comprising
a substrate with one or more first anchor points and one or more second anchor points,
a first inertial mass and a second inertial mass in a device plane, wherein the first inertial mass is suspended from the one or more first anchor points by a suspension structure configured to allow the first inertial mass to oscillate rotationally both in the device plane and out of the device plane, and the second inertial mass is suspended from the one or more second anchor points by a suspension structure configured to allow the second inertial mass to oscillate rotationally both in the device plane and out of the device plane, and
a synchronization structure which attaches the first and second inertial masses to each other, wherein the synchronization structure is configured to transmit movement between the first and second inertial masses so that the first and second inertial masses move in synchronous anti-phase drive oscillation,
wherein at least one of the suspension structures comprises
a set of first suspenders comprising one or more first suspenders coated with piezoelectric transducer structures which are configured either to drive the first suspended inertial mass or the second suspended inertial mass into an oscillating motion in the device plane, or to detect the oscillating motion of the first suspended inertial mass or the second suspended inertial mass in the device plane, wherein each of the one or more first suspenders bends much more flexibly in the device plane than out of the device plane,
a set of second suspenders comprising one or more second suspenders coated with piezoelectric transducer structures which are configured either to detect an oscillating motion of the first suspended inertial mass or the second suspended inertial mass out of the device plane, or to drive the first suspended inertial mass or the second suspended inertial mass into the oscillating motion out of the device plane, wherein each of the one or more second suspenders bends much more flexibly out of the device plane than within the device plane,
wherein the set of first suspenders and the set of second suspenders are concatenated in the at least one suspension structure.

2. A microelectromechanical gyroscope according to claim 1, wherein the transducer structures on the set of first suspenders drive the first suspended inertial mass or the second suspended inertial mass into the oscillating motion in the device plane, the transducer structures on the set of second suspenders detect the oscillating motion of the first suspended inertial mass or the second suspended inertial mass out of the device plane, and an in-plane spring constant of the set of second suspenders divided by an out-of-plane spring constant of the set of second suspenders is a ratio in the range 3 to 100.

3. A microelectromechanical gyroscope according to claim 1, wherein the transducer structures on the set of second suspenders drive the first suspended inertial mass or the second suspended inertial mass into the oscillating motion out of the device plane, the transducer structures on the set of first suspenders detect the oscillating motion of the first suspended inertial mass or the second suspended inertial mass in the device plane, and an out-of-plane spring constant of the set of first suspenders divided by an in-plane spring constant of the set of first suspenders is a ratio in the range 3 to 100.

4. A microelectromechanical gyroscope according to claim 1, wherein the set of first suspenders comprises one first suspender and the set of second suspenders comprises one second suspender, and that the set of first suspenders and the set of second suspenders are concatenated linearly, so that the first and the second suspender extend along one longitudinal axis which is parallel to a longitudinal symmetry axis of the gyroscope.

5. A microelectromechanical gyroscope according to claim 1, wherein the set of first suspenders comprises one first suspender and the set of second suspenders comprises one second suspender, and that the set of first suspenders and the set of second suspenders are concatenated in parallel via a U-turn intermediate body, so that the first suspender extends in a first longitudinal direction along a first longitudinal axis from one of the one or more first anchor points or one of the one or more second anchor points to the intermediate body, and the second suspender extends in an opposite longitudinal direction along a second longitudinal axis from the intermediate body to the first inertial mass or the second inertial mass.

6. A microelectromechanical gyroscope according to claim 4, wherein longitudinal lengths of the first and second suspenders are equal, and that a transversal width of the first suspender is less than a vertical thickness of the first suspender, but equal to the vertical thickness of the second suspender, and that a transversal width of the second suspender is equal to the vertical thickness of the first suspender.

7. A microelectromechanical gyroscope according to claim 4, wherein a vertical thicknesses of the first and second suspenders are equal, and that transversal widths of the first suspender and second suspenders are different, and that longitudinal lengths of the first and second suspenders are different, whereby both the widths and the lengths of the first and second suspenders are dimensioned so that in-plane and out-of-plane resonance frequencies of the first inertial mass the second inertial mass are essentially equal.

8. A microelectromechanical gyroscope according to claim 1, wherein the set of first suspenders comprises one first suspender and the set of second suspenders comprises two second suspenders, and that the set of first suspenders and the set of second suspenders are concatenated in parallel via a double U-turn intermediate body, so that the first suspender extends in a first longitudinal direction, along a first longitudinal axis, from one of the one or more first anchor points to one of the one or more second anchor points to the intermediate body, and the two second suspenders extend in an opposite longitudinal direction from the intermediate body to the first inertial mass or the second inertial mass along second and third longitudinal axes.

9. A microelectromechanical gyroscope according to claim 1, wherein the set of first suspenders comprises two first suspenders and the set of second suspenders comprises two second suspenders, and that the set of first suspenders and the set of second suspenders are concatenated in parallel via a frame-and-double-U-turn intermediate body which surrounds one of the one or more first anchor points or one of the one or more second anchor points, so that the two first suspenders extend in opposite longitudinal directions, along a first longitudinal axis, from said anchor point to a frame-shaped part of the intermediate body, and the two second suspenders extend in the same longitudinal direction from a double-U-turn part of the intermediate body to the first inertial mass or the second inertial mass along second and third longitudinal axes, and the second and third longitudinal axes are situated at the same distance from the first longitudinal axis, but on opposite sides of the first longitudinal axis.

10. A microelectromechanical gyroscope according to claim 1, wherein the set of first suspenders comprises two first suspenders and the set of second suspenders comprises four second suspenders, and that the set of first suspenders and the set of second suspenders are concatenated in parallel via a frame-and-double-T-intersection intermediate body which surrounds one of the one or more first anchor points or one of the one or more second anchor points, so that the two first suspenders extend in opposite longitudinal directions, along a first longitudinal axis, from said anchor point to a frame-shaped part of the intermediate body, two of the four second suspenders extend in opposite longitudinal directions from a first T-intersection part of the intermediate body to the first inertial mass or the second inertial mass along a second longitudinal axis, and two further of the four second suspenders extend in opposite longitudinal directions from a second T-intersection part of the intermediate body to the first inertial mass or the second inertial mass along a third longitudinal axis, and the second and third longitudinal axes are situated at the same distance from the first longitudinal axis, but on opposite sides of the first longitudinal axis.

11. A microelectromechanical gyroscope according to claim 1, wherein the set of first suspenders comprises one first suspender and the set of second suspenders comprises four second suspenders, and that the set of first suspenders and the set of second suspenders are concatenated in parallel via a double-U-turn-and-double-T-intersection intermediate body, so that the first suspender extends in a first longitudinal direction, along a first longitudinal axis, from one of the one or more first anchor points and one of the one or more second anchor points to a double-U-turn part of the intermediate body, two of the four second suspenders extend in opposite longitudinal directions from a first T-intersection part of the intermediate body to the first inertial mass or the second inertial mass along a second longitudinal axis, and two further of the four second suspenders extend in opposite longitudinal directions from a second T-intersection part of the intermediate body to the first inertial mass or the second inertial mass along a third longitudinal axis, and the second and third longitudinal axes are situated at the same distance from the first longitudinal axis, but on opposite sides of the first longitudinal axis.

12. A microelectromechanical gyroscope according to claim 1, wherein
the set of first suspenders comprises one first suspender and the set of second suspenders comprises two second suspenders, and that the set of first suspenders and the set of second suspenders are concatenated in parallel from a first anchor point via an E-intersection intermediate body, so that the first suspender extends in a first longitudinal direction, along a first longitudinal axis, from the first anchor point, to the transversal end of the E-intersection intermediate body, and the first suspender is flexibly attached to a transversal end of the E-intersection intermediate body, and the two second suspenders extend in a second longitudinal direction, opposite to the first longitudinal direction, from the E-intersection intermediate body to the first inertial mass or the second inertial mass along second and third longitudinal axes, and a supportive suspender extends in the first longitudinal direction from a second anchor point to the E-intersection intermediate body along a fourth longitudinal axis, and the second and third longitudinal axes are situated on opposite sides of the fourth longitudinal axis, and an in-plane spring constant of the supportive suspender is much smaller than an in-plane spring constant of the set of first suspenders, and an out-of-plane spring constant of the supportive suspender is much greater than an out-of-plane spring constant of the set of second suspenders.

* * * * *